(12) United States Patent
Bowers et al.

(10) Patent No.: US 11,024,604 B2
(45) Date of Patent: Jun. 1, 2021

(54) SEMICONDUCTOR DEVICES AND METHODS OF MANUFACTURING SEMICONDUCTOR DEVICES

(71) Applicant: Amkor Technology Inc., Tempe, AZ (US)

(72) Inventors: Shaun Bowers, Gilbert, AZ (US); Ramakanth Alapati, Dublin, CA (US)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 0 days.

(21) Appl. No.: 16/537,554

(22) Filed: Aug. 10, 2019

(65) Prior Publication Data

US 2021/0043606 A1 Feb. 11, 2021

(51) Int. Cl.
 *H01L 25/065* (2006.01)
 *H01L 25/00* (2006.01)

(52) U.S. Cl.
 CPC .......... *H01L 25/0657* (2013.01); *H01L 25/50* (2013.01); *H01L 2225/06524* (2013.01); *H01L 2225/06562* (2013.01); *H01L 2225/06586* (2013.01)

(58) Field of Classification Search
 CPC ............... H01L 25/0657; H01L 25/50; H01L 2225/06562; H01L 2225/06524; H01L 2225/06586
 USPC ......................................................... 257/777
 See application file for complete search history.

(56) References Cited

U.S. PATENT DOCUMENTS

| 7,973,310 | B2* | 7/2011 | Wang | H01L 25/50 |
| | | | | 257/48 |
| 8,525,349 | B2 | 9/2013 | Song | |
| 8,680,687 | B2* | 3/2014 | Co | H01L 24/24 |
| | | | | 257/777 |
| 8,970,046 | B2* | 3/2015 | Kim | H01L 23/3135 |
| | | | | 257/774 |
| 9,196,601 | B2 | 11/2015 | Park | |
| 9,418,922 | B2 | 8/2016 | Paek | |
| 2004/0056344 | A1 | 3/2004 | Ogawa | |
| 2006/0258044 | A1 | 11/2006 | Meyer et al. | |
| 2008/0290492 | A1 | 11/2008 | Chung et al. | |
| 2008/0303131 | A1 | 12/2008 | McElrea | |
| 2009/0140442 | A1 | 6/2009 | Lin | |
| 2010/0140759 | A1 | 6/2010 | Pagaila | |
| 2010/0181661 | A1* | 7/2010 | Takemoto | H01L 24/24 |
| | | | | 257/686 |

(Continued)

FOREIGN PATENT DOCUMENTS

| JP | 2010165984 A | 7/2010 |
| KR | 20110077213 A | 7/2011 |
| KR | 20130016543 A | 2/2013 |

*Primary Examiner* — Vu A Vu
(74) *Attorney, Agent, or Firm* — Kevin B. Jackson

(57) ABSTRACT

A packaged semiconductor device includes a substrate with first and second opposing major surfaces. A stacked semiconductor device structure is connected to the first major surface and includes a plurality of semiconductor die having terminals. Conductive interconnect structures electrically connect the terminals of the semiconductor dies together. The semiconductor dies are stacked together so that the terminals are exposed, and the stacked semiconductor device structure comprises a stepped profile. The conductive interconnect structures comprise a conformal layer that substantially follows the stepped profile.

17 Claims, 22 Drawing Sheets

(56) References Cited

U.S. PATENT DOCUMENTS

| | | |
|---|---|---|
| 2010/0244208 A1 | 9/2010 | Pagaila |
| 2011/0068427 A1 | 3/2011 | Paek et al. |
| 2011/0084382 A1 | 4/2011 | Chen et al. |
| 2011/0233782 A1 | 9/2011 | Chang et al. |
| 2012/0326307 A1 | 12/2012 | Jeong et al. |

\* cited by examiner

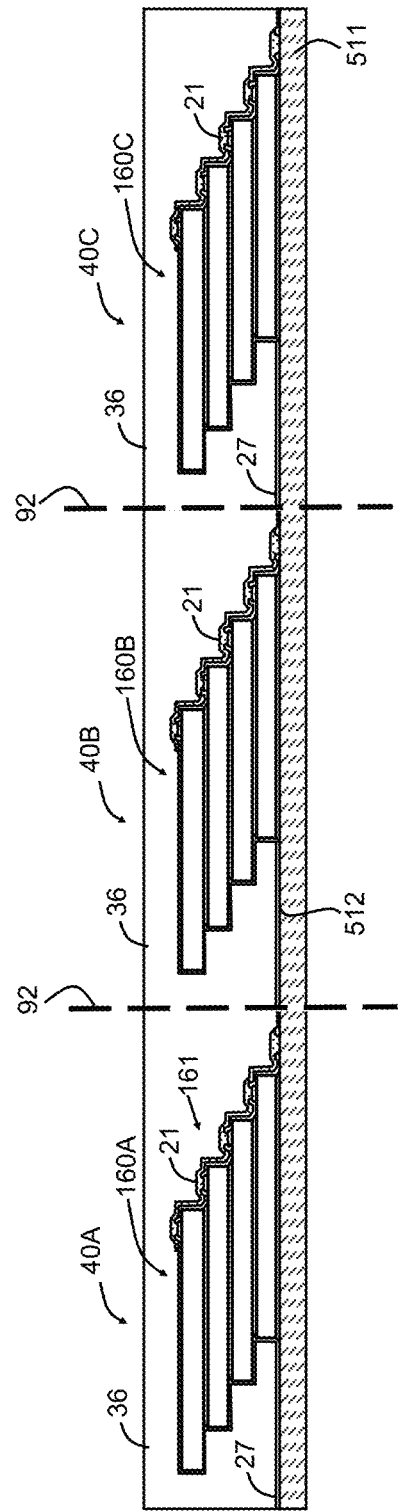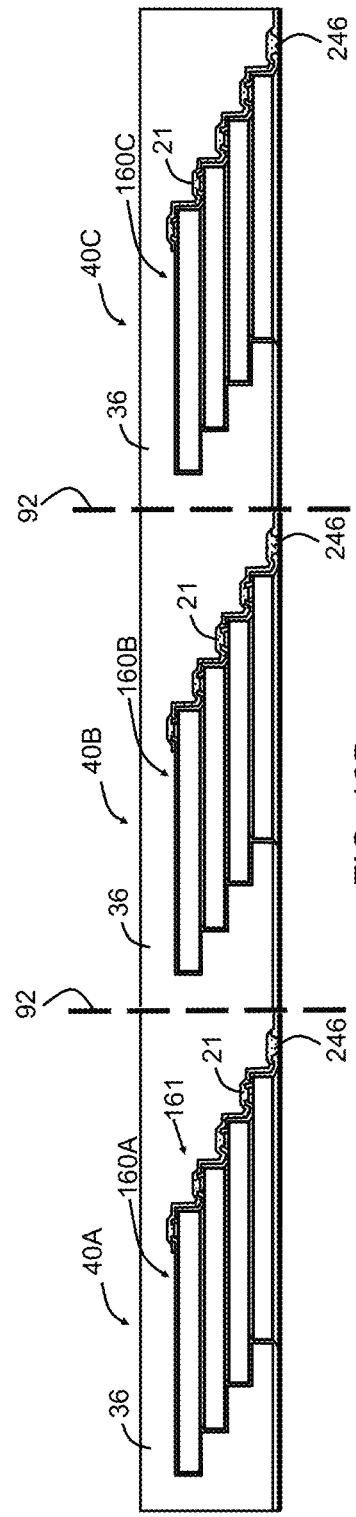

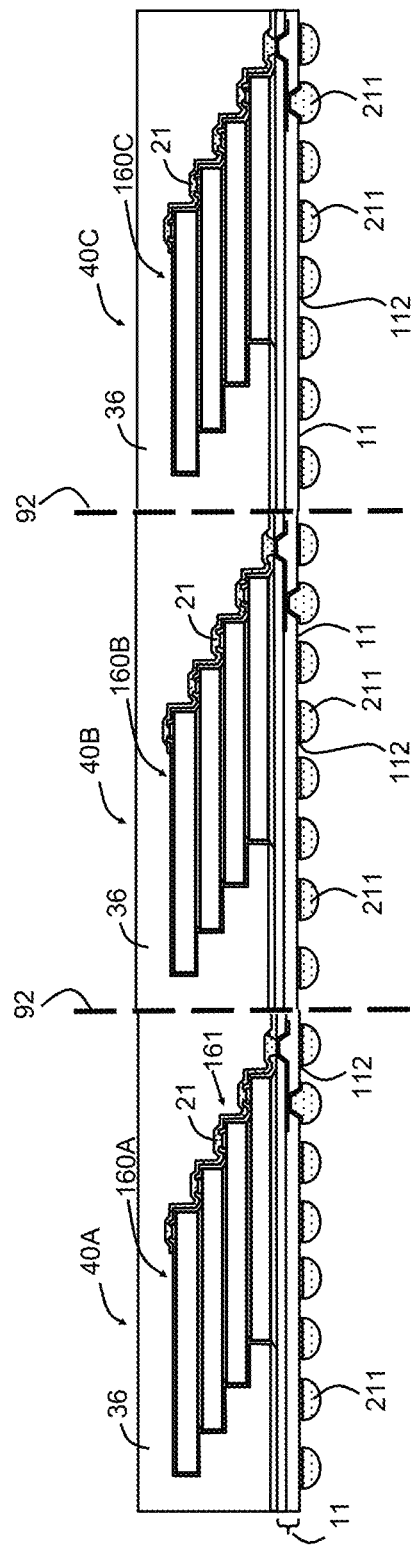
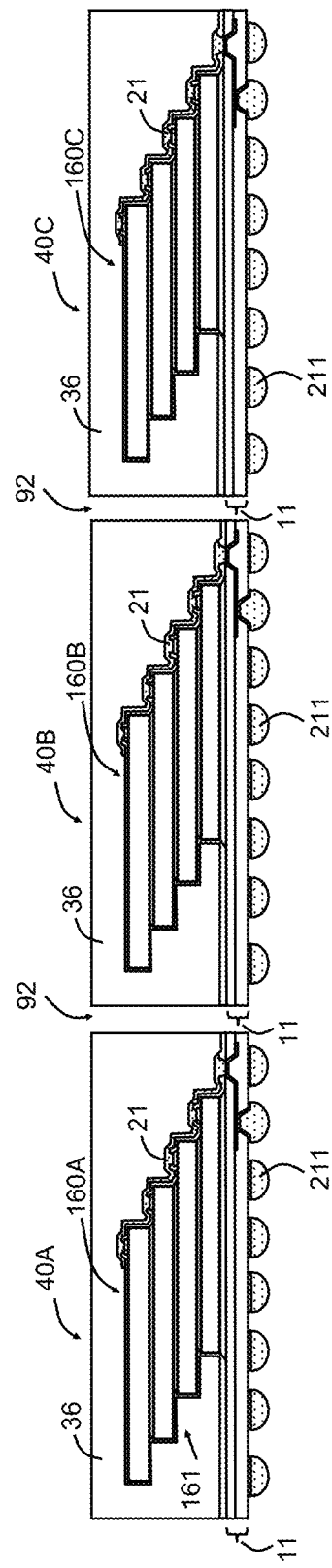
FIG. 11C
FIG. 11D

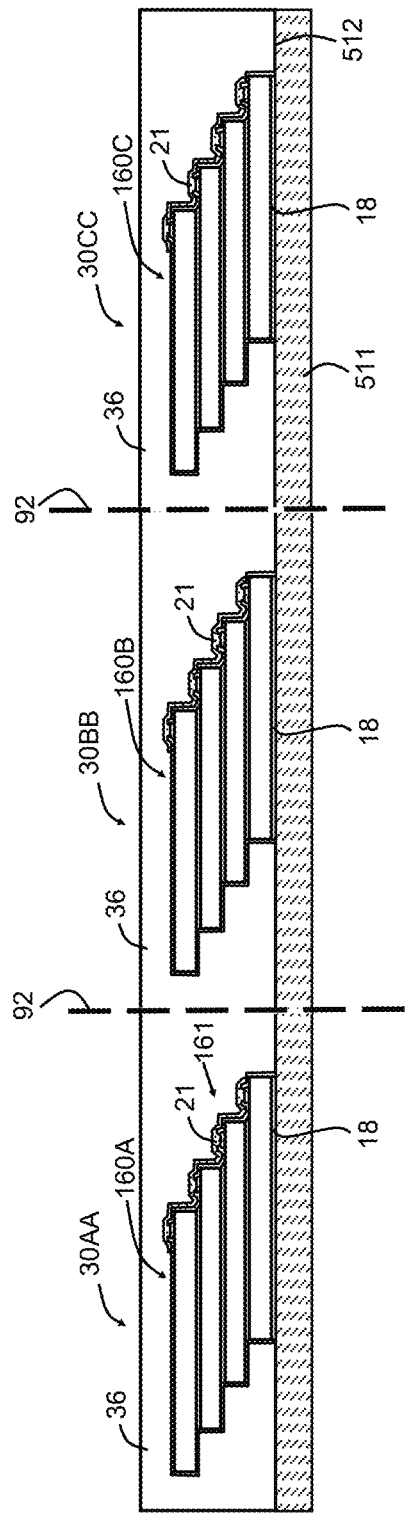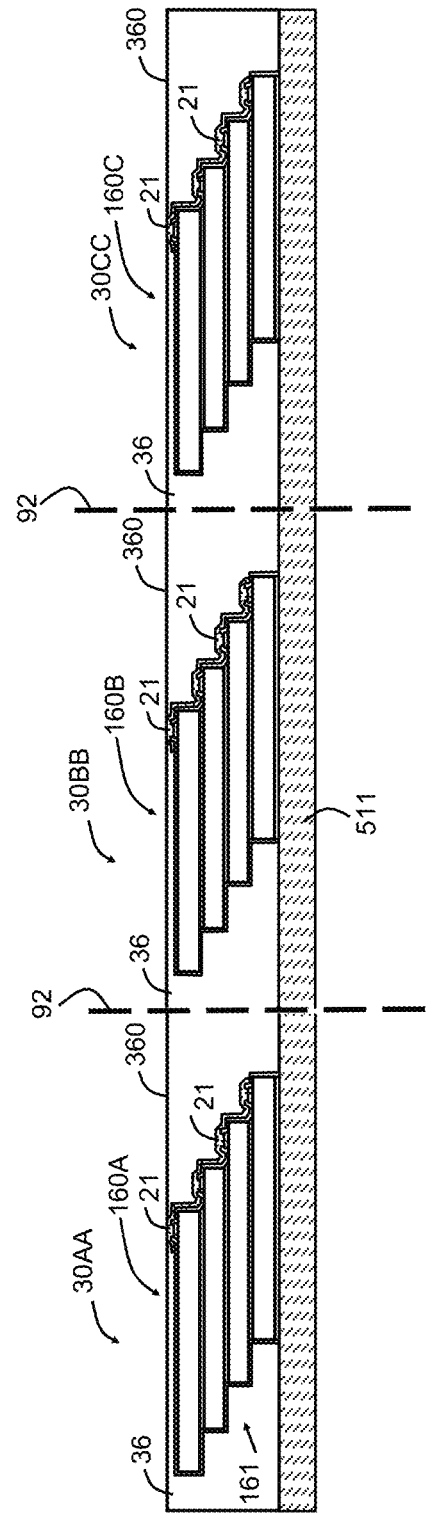
FIG. 12A
FIG. 12B

SEMICONDUCTOR DEVICES AND METHODS OF MANUFACTURING SEMICONDUCTOR DEVICES

CROSS-REFERENCE TO RELATED APPLICATIONS

Not Applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 10A, 10B, 10C, and 10D illustrate partial cross-sectional views of a plurality of packaged electronic devices of the present description at various steps in fabrication;

FIGS. 11A, 11B, 11C, and 11D illustrate partial cross-sectional views of a plurality of packaged electronic devices of the present description at various steps in fabrication;

FIGS. 12A, 12B, 12C, and 12D illustrate partial cross-sectional views of a plurality of packaged electronic devices of the present description at various steps in fabrication;

Figure 1:
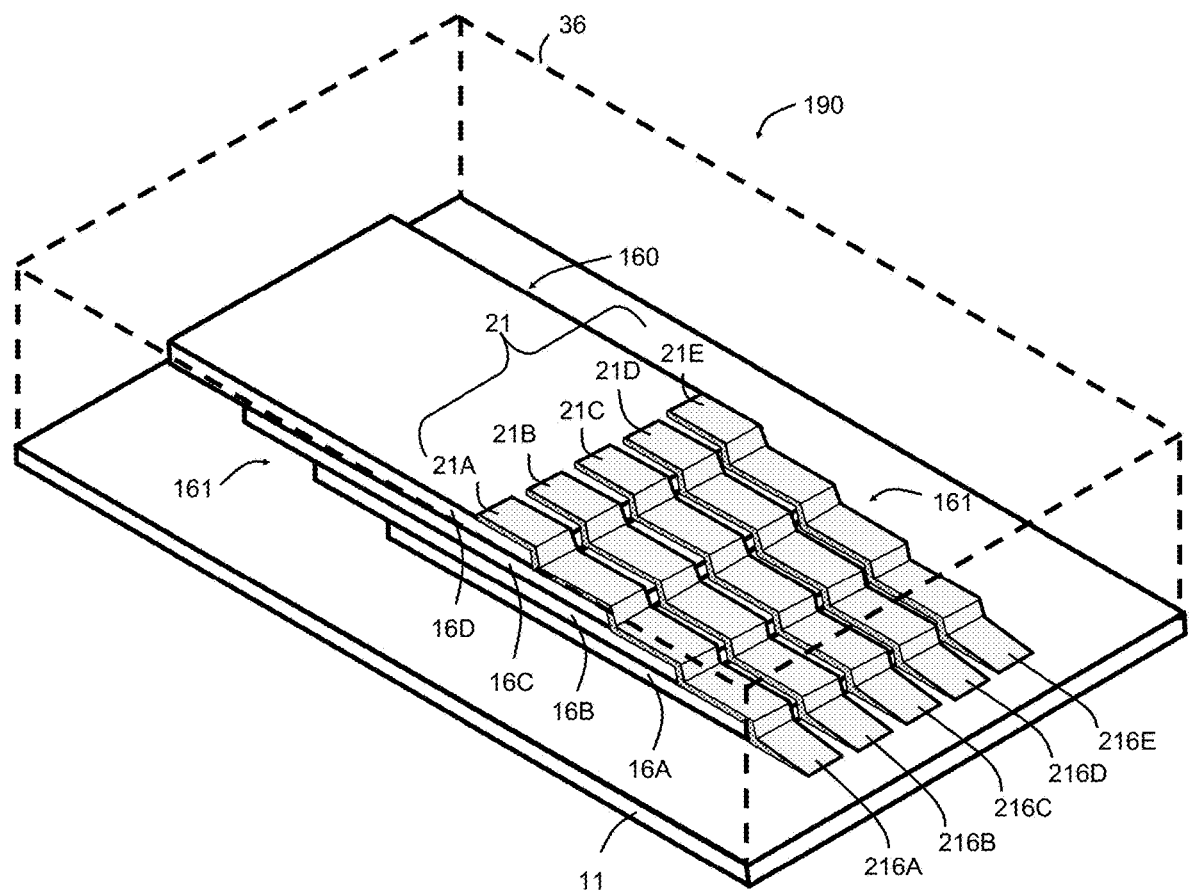
FIG. 1 illustrates a perspective view of a packaged electronic device of the present description.

For simplicity and clarity of the illustration, elements in the figures are not necessarily drawn to scale, and the same reference numbers in different figures can denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular example embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one example" or "an example" means that a particular feature, structure or characteristic described in connection with the embodiment is included in at least one example of the present invention. Thus, appearances of the phrases "in one example" or "in an example" in various places throughout this specification are not necessarily all referring to the same example, but in some cases it may. Furthermore, the particular features, structures or characteristics may be combined in any suitable manner, as would be apparent to one of ordinary skill in the art, in one or more example embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}. It is further understood that the examples illustrated and described hereinafter suitably may have examples and/or may be practiced in the absence of any element that is not specifically disclosed herein. Unless specified otherwise, the term "coupled" may be used to describe physical or electrical coupling of elements that directly contact each other or that are indirectly connected by one or more other elements. For example, if element A is coupled to element B, then element A can be directly contacting element B or indirectly connected to element B by an intervening element C.

DETAILED DESCRIPTION

The present description includes, among other features, a packaged electronic device and associated methods that comprise a stacked semiconductor device structure with semiconductor dies connected in an offset-stacked configuration that exposes terminals of the semiconductor dies. Conductive interconnect structures comprising a conformal configuration electrically connect the terminals of the semiconductor dies together. In some examples, the conformal configuration follows a stepped shape provided by the offset-stacked configuration of the stacked semiconductor device structure.

In some examples, the conductive interconnect structures electrically connect one or more of the semiconductor dies to a substrate that the stacked semiconductor device structure can be attached to. In some examples, the conductive interconnect structures are isolated from the semiconductor dies by a dielectric layer. In some examples, the conductive interconnect structures or the dielectric layer are formed using 3D printing techniques. In other examples, masked plating techniques can be used to form the conductive interconnect structures.

In some examples, a package body covers the stacked semiconductor device structure to an encapsulated stacked semiconductor device structure. In further examples, a plurality of the encapsulated stacked semiconductor device structures can be attached together to support various package-in-package (PIP) configurations. In some examples, the conductive interconnect structures comprising conformal layers can electrically connect the encapsulated stacked semiconductor devices together in the PIP configurations. The conductive interconnect structures facilitate packaged semiconductor devices having thinner profiles compared to related devices. In addition, the conductive interconnect structures provide for flexible interconnect configurations between the semiconductor dies and/or the substrate.

In a further example, a first semiconductor die can be attached to substrate and a dielectric layer can be disposed so as to cover one or more side surfaces of the first semiconductor die proximate to conductive terminals provided as part of the first semiconductor die. In some examples, the dielectric layer is located substantially only along the lateral surfaces proximate to the conductive structures without extending substantially over the major surface of the first semiconductor die (i.e., a substantial portion of the major surface of the first semiconductor die is not covered by the dielectric layer). One or more conductive interconnect layers comprising conformal layers electrically connect the conductive terminals of the first semiconductor die to the substrate. In other examples, additional semiconductor dies can be attached to the to the first semiconductor die in an offset-stacked configuration and can also be electrically connected to the first semiconductor die and/or the substrate with the conductive interconnect layers. In some examples, other dielectric layers can be provided substantially only sides surfaces of the additional semiconductor dies. In some examples, the dielectric layer along the lateral surface of the first semiconductor die comprises an outer surface having an arcuate shape. This shape advantageously provides for a non-abrupt transition of the conductive interconnect layers from the first semiconductor die to a next semiconductor or a substrate.

In one example, a packaged semiconductor device, comprises a substrate having a first major surface and a second major surface opposite to the first major surface, the substrate comprising one or more organic dielectric layers. A stacked semiconductor device structure is coupled to the first major surface and comprises semiconductor dies having respective die terminals, wherein the semiconductor dies are coupled together so that the respective die terminals are exposed, and the stacked semiconductor device structure comprises a stepped profile. Conductive interconnect structures are over portions the stacked semiconductor device structure and couple the die terminals of the semiconductor dies together, wherein the conductive interconnect structures comprise a conformal layer that substantially conforms to the stepped profile. In some examples, the conductive interconnect structures comprise a 3D printed conformal layer. In other examples, the conductive interconnect structures comprise a plated layer. In some examples, at least one of the conductive interconnect structures is over the substrate and electrically couples at least one of the semiconductor dies to the substrate.

In one example, a method of forming a packaged semiconductor device, includes providing a substrate having a first major surface and a second major surface opposite to the first major surface, the substrate comprising one or more organic dielectric layers. The method includes providing a stacked semiconductor device structure comprising semiconductor dies each having respective die terminals. The method includes providing conductive interconnect structures over portions of the stacked semiconductor device structure, the conductive interconnect structures coupling the die terminals of the semiconductor die together, wherein the semiconductor dies are coupled together so that the respective die terminals are exposed and the stacked semiconductor device structure comprises a stepped profile, the stacked semiconductor device structure is coupled to the substrate; and the conductive interconnect structures comprise a conformal layer that substantially follows the stepped profile.

In one example, a packaged semiconductor device, includes a first substrate having a first major surface and a second major surface opposite to the first major surface, and first substrate terminals disposed proximate to the second surface of the first substrate, the substrate comprising one or more organic dielectric layers. A first stacked semiconductor device structure is coupled to the first major surface of the first substrate and comprising first semiconductor dies each having first die terminals, where the first semiconductor dies are coupled together so that the first die terminals are exposed and the first stacked semiconductor device structure comprises a first stepped profile. First conductive interconnect structures electrically couple the first die terminals of the first semiconductor dies together, where the first conductive interconnect structures substantially conform to the first stepped profile. A first package body covering the first stacked semiconductor device structure.

In one example, a packaged semiconductor device, includes a substrate having a first major surface and a second major surface opposite to the first major surface, the substrate having substrate terminals proximate to the first major surface. A first semiconductor die is coupled to the first major surface and having first die terminals, and a first dielectric layer is disposed adjacent to an edge surface of the first semiconductor die proximate to the first die terminals.

Conductive interconnect structures are conformal to a portion of the first semiconductor die, the first dielectric layer, and the first major surface of the substrate, the conductive interconnect structures coupling the first die terminals to the substrate terminals. In another example, the packaged semiconductor device can further include a second semiconductor die coupled to the first semiconductor die to provide a stacked semiconductor device structure. The second semiconductor die can include second die terminals and the second semiconductor die can be attached to the first semiconductor die, laterally offset to expose the first die terminals. A second dielectric layer can be disposed adjacent to an edge surface of the second semiconductor die proximate to the second die terminals. The conductive interconnect structures can be conformal to a portion of the second semiconductor die and the second dielectric layer to couple the second die terminals to at least the first die terminals.

Other examples are included in the present disclosure. Such examples may be found in the figures, in the claims, and/or in the description of the present disclosure.

FIG. 1 illustrates a perspective view of an example packaged electronic device 10, such as a packaged semiconductor device 10 in accordance with the present description. In the example presented in FIG. 1, packaged electronic device 10 comprises a substrate 11; electronic components 16A, 16B, 16C, and 16D, such as electronic devices 16A-16D, semiconductor devices 16A-16D, semiconductor components 16A-16D, packaged semiconductor devices 16A-D, or semiconductor die 16A-16D; conductive interconnect structures 21, such as conductive interconnect structures 21A, 21B, 21C, 21D, and 21E; and an enclosure structure 36, such as encapsulant 36 or package body 36. Package body 36 is presented in FIG. 1 as transparent to disclose the internal contents of packaged electronic device 10. It is understood that package body 36 may not be transparent and may be opaque. In addition, it is understood that the term "semiconductor die" as used herein can be in the singular as well as plural as in a plurality of semiconductor die (i.e., more than one).

In accordance with the present description, semiconductor die 16A-16D are attached to each other in an offset-stacked shape, profile, or outline 161, or a stepped configuration, profile, or outline 161 to allow or facilitate electrical connection or electrical communication between semiconductor die 16A-16D and/or between semiconductor die 16A-16D and substrate 11. In the present description, the configuration of semiconductor die 16A-16D may also be referred to as a stacked semiconductor device structure 160. In addition, conductive interconnect structures 21A-21E are provided as substantially conformal conductive layers or traces that conform to or mimic the offset-stacked shape 161 of semiconductor die 16A-16D or stacked semiconductor device structure 160. That is, conductive interconnect structures 21A-21E follow the stepped outline 161 of semiconductor die 16A-16D so as to also comprise a stepped outline. In this way, packaged electronic device 10 is provided with a lower profile electrical interconnect structure, which, among other things, facilitates a thinner size or profile compared to prior devices.

Substrate 11, conductive interconnect structures 21A-21E, and package body 36 can be referred to as a semiconductor package 190, and semiconductor package 190 can provide protection for semiconductor die 16A-16D from external elements and/or environmental exposure. In addition, semiconductor package 190 can provide electrical coupling from external electrical components (not shown) to conductive interconnect structures 21A-21E and semiconductor die 16A-16D.

Substrate 11 can be selected from common circuit boards (for example, rigid circuit boards and flexible circuit boards), multi-layer substrates, laminate substrates, core substrates with build-up layers, coreless substrates, ceramic substrates, lead frame substrates, molded lead frame substrates, or similar substrates as known to one of ordinary skill in the art. In this regard, the present description is not intended to be limited to any particular type of substrate 11. Semiconductor die 16A-16D can be the same type of semiconductor device or different types of semiconductor devices within stacked semiconductor device structure 160. In some examples, semiconductor die 16A-16D can comprise integrated circuit devices, such as memory devices, application specific integrated circuit devices ("ASICs"), controller devices, power devices, signal processing devices, microcontroller devices, microprocessor devices, sensor devices, optical devices, or other devices as known to those of ordinary skill in the art. As will explained in more detail later, conductive interconnect structures 21A-21E comprises a conductive material, such as one or metals, and can be provided with plating, printing, or other deposition techniques.

Figure 2A:
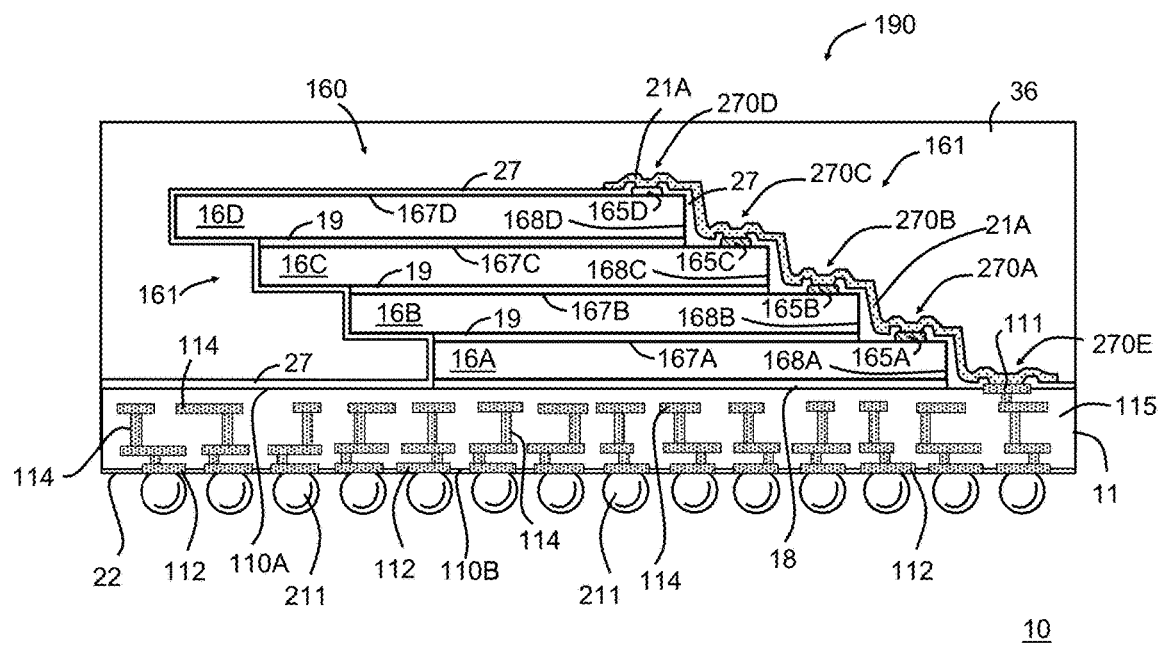
FIG. 2A illustrates a cross-sectional view of a packaged electronic device of the present description.

FIG. 2A illustrates a cross-sectional view of a packaged electronic device, such as packaged semiconductor device of 10 (or other packaged electronic devices as described herein) in accordance with the present description. In the present example, semiconductor die 16A is attached or connected to a substrate top surface 110A of substrate 11 with an attachment material 18. Semiconductor die 16A is provided with one or more die terminals 165A, such as conductive pads 165A disposed above, on, as part of, or within semiconductor die 16A. Conductive pads 165A can comprise conductive materials, such as one or more metal materials, and can be provided using evaporation, sputtering, plating, or other deposition techniques. The conductive pads can be patterned using masking and etching techniques. In some examples, conductive pads 165A are configured to facilitate the input and output of electrical signals to and from semiconductor die 16A. Such signals can include data signals, bias signals, ground signals, or other signals as known to those of ordinary skill in the art.

Substrate 11 can be provided with substrate terminals 111 or conductive pads 111 proximate to substrate top surface 110A, which can be further connected through conductive layers/vias 114 within substrate 11 to conductive pads 112 or conductive lands 112 proximate to a substrate bottom surface 110B of substrate 11. Substrate 11 further includes a dielectric or passivation structure 115 comprising one or more dielectric layers. Dielectric structure 115 can comprise one or more organic dielectric layers. In some examples, substrate 11 can be further provided with a solder mask structure 22 proximate to substrate bottom surface 110B between conductive lands 112.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be mainly formed of organic materials. The dielectric layers can be relatively thicker non-photo-definable layers that can be attached as a pre-formed film rather than as a liquid and can include a resin with fillers such as strands, weaves, and/or other particles for rigidity and/or structural support.

Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

In some examples, external interconnects 211 can attached to conductive lands 112, and can comprise conductive materials, such as solder balls, solder bumps, copper bumps, nickel gold bumps, or similar materials as known to one of ordinary skill in the art. In other examples, external interconnects 211 are omitted and conductive lands 112 can be configured to directly connect or attach to a next level of assembly, such as a printed circuit board.

Attachment material 18 can comprise a thermally conductive and electrically conductive material, or a thermally conductive and electrically non-conductive material. In some examples, attachment material 18 comprises an epoxy-type die attach material. In other examples, attachment material 18 can be a solder material, such as a solder paste or other materials as known to one of ordinary skill in the art. Attachment material 18 typically functions to provide mechanical fixation of semiconductor die 16A to substrate 11. In other examples, attachment material 18 can enable thermal transfer from semiconductor die 16A to substrate 11.

Semiconductor die 16B is attached to a top surface of semiconductor die 16A with an attachment material 19, which can be similar to or different than attachment material 18. In some examples, attachment material 19 comprises an epoxy-type die attach material. In some examples, and similar to semiconductor die 16A, semiconductor die 16B further comprises die terminals 165B, such as conductive pads 165B disposed above, on, as part of or within semiconductor die 16B. Attachment material 19 typically functions to provide mechanical fixation of semiconductor die 16B to semiconductor die 16A. Semiconductor die 16C is attached to a top surface of semiconductor die 16C with attachment material 19 and includes die terminals 165C, such as conductive pads 165C disposed above, on, as part of, or within semiconductor die 16C. Semiconductor die 16D is attached to a top surface of semiconductor die 16C with attachment material 19 and includes die terminals 165D, such as conductive pads 165D disposed above, on, as part of, or within semiconductor die 16D. Attachment material 19 typically functions to provide mechanical fixation of semiconductor die 16B to semiconductor die 16A, mechanical fixation of semiconductor die 16C to semiconductor die 16B, and semiconductor die 16D to semiconductor die 16C. In other examples, attachment material 19 can be configured to enable thermal transfer from the semiconductor die 16 to substrate 11 or one or more other heat sink structures (not shown).

In accordance with the present description, semiconductor die 16A-16D are provided having offset-stacked shape 161. This provides stacked semiconductor device structure 160 with conductive pads 165A-165D of semiconductor die 16A-16D exposed to the outside to facilitate electrical interconnection between semiconductor die 16A-16D. In some examples, conductive pads 165A-165D may comprise aluminum, aluminum alloys, copper, solderable metals, or other conductive materials as known to one of ordinary skill in the art.

It is understood that although stacked semiconductor device structure 160 is illustrated with four semiconductor dies 16A-16D, more or fewer semiconductor die can be used in accordance with the present description including a single semiconductor die 16. In addition, one of ordinary skill in the art will appreciate that semiconductor die 16A-16D are illustrated in simplified form to not distract from the present description, and may further include multiple diffused regions, multiple conductive layers, and multiple dielectric layers.

In accordance with the present description, insulating film 27, dielectric layer 27, passivating film 27, passivation layer 27, or passivation structure 27 is provided on or some or all exposed surfaces of stacked semiconductor device structure 160 and substrate top surface 110A of substrate 11. In some examples, dielectric layer 27 can cover all lateral surfaces of at least one of semiconductor dies 16. In some examples, dielectric layer 27 comprises an inorganic dielectric, such as an oxide material like silicon oxide, silicon nitrides, aluminum oxide, zirconium oxide, or hafnium oxide, combinations thereof, or similar materials as known to one of ordinary skill in the art. In one example, dielectric layer 27 can be zirconium oxide in a polymeric suspension (for example, PVP), and can have at thickness in a range from about 2 microns through about 50 microns. In some examples, dielectric layer 27 can comprise an organic material such as polyimides, polymers, polyimide silicones, other silicones, elastomers, UV curable materials, thermoset liquid-crystalline polymers, such as polybenzoxazole (PBO), combinations thereof, or similar materials as known to one skilled in the art. In some examples, dielectric layer 27 can be formed using deposition, dispensing, coating, or screen-printing techniques. In some examples, dielectric layer 27 can be cured after deposition. In further examples, dielectric layer 27 can include one or more different layers of materials.

Openings 270A, 270B, 270C, and 270D are provided in dielectric layer 27 above or adjacent to conductive pads 165A, 165B, 165C, and 165D to expose at least portions of conductive pads 165A-165D respectively. In addition, openings 270E are provided above or adjacent to conductive pads 111 on substrate 11. Openings 270A-270E can be provided using masking and removal processes, such as photolithographic masking processes and etching processes. In some examples, the masking layer is provided prior to the formation of dielectric layer 27. In other examples, the masking layer is provided after the formation of dielectric layer 27. In some examples, dielectric layer 27 has a thickness in a range from about 2 microns through about 50 microns or more. In some examples, dielectric layer 27 has a thickness in a range from about 2 microns to about 10 microns. In other examples, dielectric layer 27 has a thickness in a range from about 25 microns to about 50 microns or more.

Conductive interconnect structures 21 are disposed over or overlying stacked semiconductor device structure 160 to electrically connect semiconductor dies 16A-16D together and, in some examples, to electrically connect one or more of semiconductor dies 16A-16D to substrate 11. In accordance with the present description, conductive interconnect structures 21 have a shape that substantially conforms to or substantially mimics the shape of stacked semiconductor device structure 160. Conductive interconnect structures 21 are disposed over or overlapping top surfaces 167A, 167B, 167C, and 167D as well as lateral surfaces 168A, 168B, 168C, and 168D of semiconductor die 16A-16D.

FIG. 2A illustrates conductive interconnect structure 21A, which is one of conductive interconnect structures 21. In some examples, conductive interconnect structures 21 comprise one or more metals, such as copper, copper alloys, gold, silver, or other conductive materials as known to one of ordinary skill in the art. In some examples, conductive interconnect structures 21 can be provided using 3D printing techniques, which generally refers to a method where an additive process is used to form a three-dimensional object based on a digitally created file of the object. More particularly, the object can be created by laying down many thin layers of a material in succession using a 3D printing apparatus. Examples of types of 3D printing include metal printing, such as selective laser melting (SLM) and electron beam melting (EBM); selective laser sintering (SLS); jetting processes, stereolithography (SLA); and fusion deposition modeling (FDM). In other examples, conductive interconnect structures 21 can be formed using plating, deposition, coating, dispensing, or screen-printing techniques. In further examples, conductive interconnect structures 21 can include one or more layers comprising different materials. In some examples, 3D printing techniques also can be used to form dielectric layer 27 or portions thereof.

In some examples, conductive interconnect structures 21 can include end portions 216A, 216B, 216C, 216D, and 216E as illustrated in FIG. 1, which taper in their thickness from thick to thin where conductive interconnect structures 21A-21E terminate on substrate 11. In some examples, end portions 216A-216E can each comprise a wedge-shape as illustrated in FIG. 1. One advantage of such a shape is that it reduces sharp edges and/or corners where end portions 216A-216E terminate thereby reducing the likelihood of damaging conductive interconnect structures 21A-21E during subsequent processing. In some examples, 3D printing techniques can be used to provide end portions 216A-216E in a desired shape, such as the tapered shape described herein.

In some examples, package body 36 can be a polymer based composite material, such as epoxy resin with filler, epoxy acrylate with filler, or polymer with proper filler. Package body 36 comprises a non-conductive and environmentally protective material that protects stacked semiconductor device structure 160 from external elements and contaminants. Package body 36 may be formed using paste printing, compressive molding, transfer molding, overmolding, liquid encapsulant molding, vacuum lamination, other suitable applicators, or other processes as known to those of skill in the art. In some embodiments, package body 36 is an epoxy mold compound ("EMC") and can be formed using transfer or injection molding techniques.

Figures 2B, 2C:
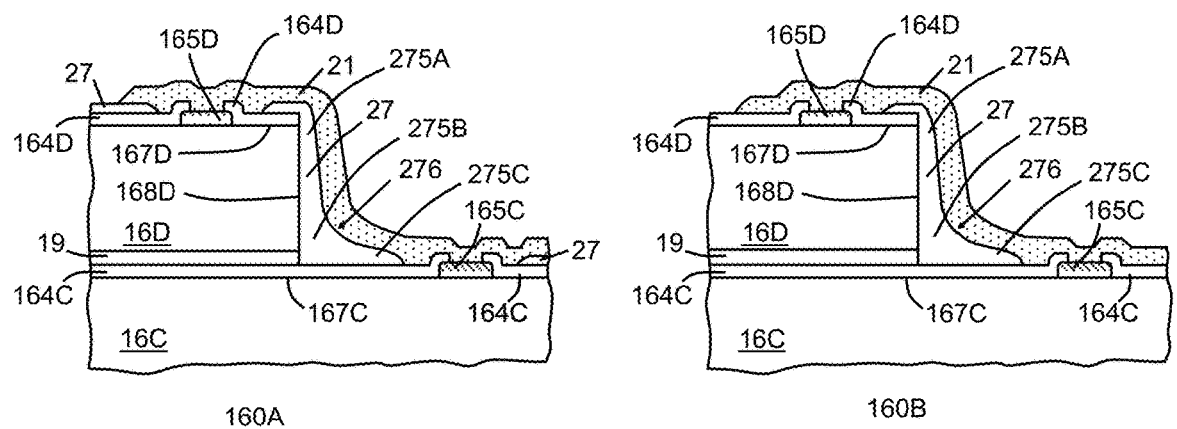
FIG. 2B illustrates an enlarged partial cross-sectional view of a stacked semiconductor device structure of the present description.
FIG. 2C illustrates an enlarged partial cross-sectional view of a stacked semiconductor device structure of the present description.

FIG. 2B illustrates an enlarged partial cross-sectional view of an example stacked semiconductor device structure 160A in accordance with the present description. It is understood that stacked semiconductor device structure 160A can be used with any of the example packaged electronic devices described herein (for example, packaged electronic devices 10, 10A, 10AA, 10BB, 10CC, 20, 30, 30AA, 30BB, 30CC, and/or 40) and any variations thereof. Stacked semiconductor device 160A only illustrates the details of semiconductor dies 16D and 16C, but it is understood that similar features can be included with semiconductor dies 16B and/or 16A as well as additional semiconductor die included in stacked semiconductor device 160A.

As illustrated in FIG. 2B, semiconductor die 16D includes a passivation layer 164D over top surface 167D and semiconductor die 16C includes a passivation layer 164C over top surface 167C. Passivation layers 164C and 164D can be one or more dielectric layers, such silicon oxides, silicon nitrides, or combinations thereof, or passivation layers 164C and 164D can be a polymer material, such as polyimide material. Passivation layers 164C and 164D function to protect and electrically insulate active devices and conductive interconnects within or on semiconductor die 16C and semiconductor die 16D. As illustrated in FIG. 2B, passivation layer 164D is provided with an opening to expose die terminal 165D and passivation layer 164C is provide with an opening to expose die terminal 164C. Passivation layers 164C and 164D can be formed while semiconductor die 16C and 16D are in wafer form. Processing techniques such as chemical vapor deposition (including low-pressure, low temperature, or plasma-enhanced), spin-on deposition, thermal oxidation, or similar processes can be used to form passivation layers 164C and 164D. The openings in passivation layers 164C and 164D can be provided using photolithographic and etching techniques.

In some examples, dielectric layer 27 is over portions passivation layer 164D above top surface 167D of semiconductor die 16D and includes an opening to expose portions of passivation layer 164D and die terminal 165D. That is, in the present example, dielectrically layer 27 covers or is over a substantial portion of top surface 167D. Dielectric layer 27 is further disposed over lateral surface 168D of semiconductor die 16D. In accordance with the present description, the portion of dielectric layer 27 over lateral surface 168D and a portion of top surface 167C of semiconductor die 16C does not have a uniform thickness. In some examples, this portion of dielectric layer 27 has a thickness 275B where lateral surface 168D meets or adjoins attachment material 19 and passivation layer 164C of semiconductor die 16C. In some examples, thickness 275B is thicker than a thickness 275A of dielectric layer 27 toward top surface 167D of semiconductor die 16D and thicker than a thickness 275C of dielectric layer 27 along top surface 167C of semiconductor die 16C where dielectric layer 27 approaches die terminal 165C. In addition, the outer surface of dielectric layer 27 over lateral surface 168D of semiconductor die 16D and top surface 167C of semiconductor die 16C has an arcuate shape or curved shape 276 as illustrated in FIG. 2B, which beneficially provides a smoother transition region or non-abrupt transition region for conductive connective structures 21 between the semiconductor dies. This avoids sharp corners, notches, or transitions, which can result in conductive connective structures 21 having thinner regions or missing portions. Such defects can result in reliability problems from issues such as increased resistance, which can cause hot spots. As illustrated in FIG. 2B, conductive connective structure 21 beneficially follows the contour of dielectric layer 27 so that conductive connective structure 21 has a more uniform thickness as it transitions from semiconductor die 16D to semiconductor die 16C.

FIG. 2C illustrates an enlarged partial cross-sectional view of an example stacked semiconductor device structure 160B in accordance with the present description. It is understood that stacked semiconductor device structure 160B can be used with any of the example packaged electronic devices described herein (for example, packaged electronic devices 10, 10A, 10AA, 10BB, 10CC, 20, 30, 30AA, 30BB, 30CC, and/or 40) and any variations thereof.

Stacked semiconductor device 160B only illustrates the details of semiconductor dies 16D and 16C, but it is understood that similar features can be included with semiconductor dies 16B and/or 16A as well as additional semiconductor die included in stacked semiconductor device 160B.

Stacked semiconductor device structure 160B is similar to stacked semiconductor device structure 160A and only the differences will be described. In stacked semiconductor device structure 160B, dielectric layer 27 is disposed primarily over the lateral surfaces of the semiconductor die, such as lateral surface 168D, 168C, etc., and disposed over only a portion of top surfaces of the semiconductor die adjoining the lateral surfaces. That is, in the present example, a substantial portion of top surface 167D of semiconductor die 16D is not covered by dielectric layer 27. In some examples, a portion of dielectric layer 27 is only over top surface 167D between die terminal 165D and lateral surface 168D. Dielectric layer 27 in stacked semiconductor device structure 160B has the same features as stacked semiconductor device structure 160A including the arcuate shape 276, which provides for a smoother transition for conductive connective structures 21 thereby improving reliability of stacked semiconductor device structure 160B.

Figure 3:
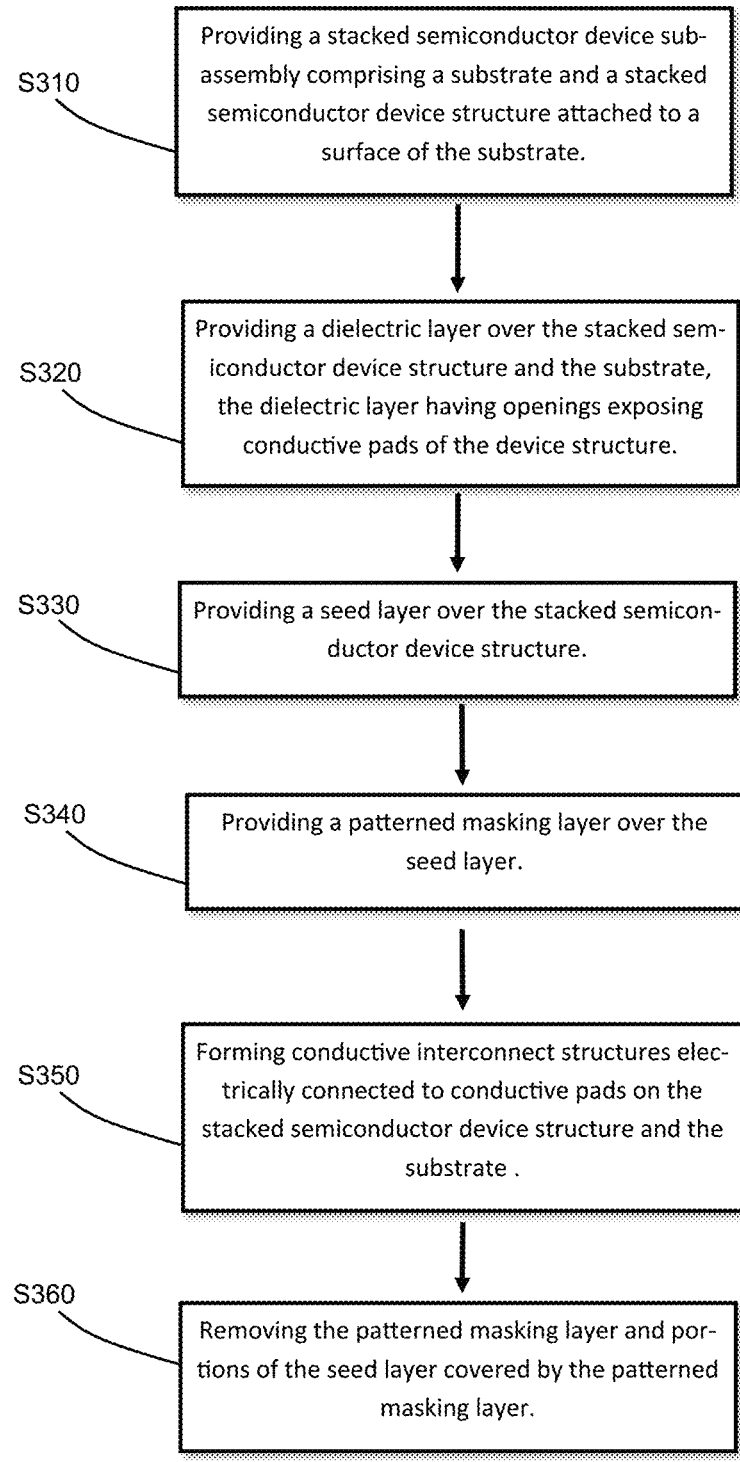
FIG. 3 is a flow chart illustrating an example method for manufacturing packaged electronic devices of the present description.

FIG. 3 is a flow chart illustrating an example method 300 for providing a packaged electronic device having conductive interconnect structures, such as packaged semiconductor device 10 having a stacked semiconductor device structure 160 and conductive interconnect structures 21A-21E. FIGS. 4A, 4B, 4C, 4D, 4E, and 4F are cross-sectional views of packaged semiconductor device 10 at various stages of fabrication in accordance with method 300.

Block S310 of method 300 comprises providing a stacked semiconductor device sub-assembly comprising a substrate and a stacked semiconductor device structure attached to a surface of the substrate. For instance, the substrate can be similar to substrate 11, and the stacked semiconductor device structure can be similar to stacked semiconductor device structure 160 as presented in FIG. 4A, which is a cross-sectional view of a stacked semiconductor device sub-assembly 10A at a step fabrication. It is understood that although only one stacked semiconductor device is shown, multiple stacked semiconductor devices can be provided as will be described later. In other examples, a single semiconductor die, such as semiconductor die 16A can be the only semiconductor die attached to substrate 11.

In some examples, the substrate, such as substrate 11 can be selected from common circuit boards (for example, rigid circuit boards and flexible circuit boards), multi-layer substrates, laminate substrates, core substrates with build-up layers, coreless substrates, ceramic substrates, lead frame substrates, molded lead frame substrates, or similar substrates as known to one of ordinary skill in the art. In other examples, the substrate is a copper-based leadframe (for example, a leadframe comprising copper/iron/phosphorous; 99.8/0.01/0.025), a copper alloy-based leadframe (for example, a leadframe comprising copper/chromium/tin/zinc; 99.0/0.25/0.22), or an alloy 42-based leadframe (for example, a leadframe comprising iron/nickel; 58.0/42.0). In further examples, the substrate can comprise other conductive or non-conductive materials, which may be further plated (in whole or in part) with one or more conductive layers.

Figure 4A:
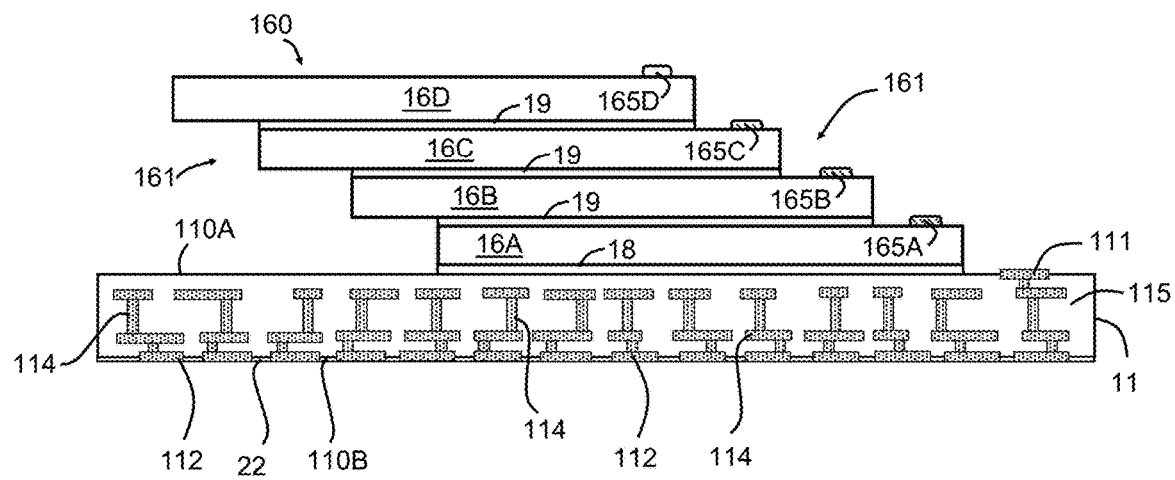
FIGS. 4A, 4B, 4C, 4D, 4E, and 4F illustrate cross-sectional views of a packaged electronic device at various stages of fabrication in accordance with the method of FIG. 3.

In some examples, stacked semiconductor device structure 160 is connected to substrate top surface 110A of substrate 11 with attachment material 18 as described previously. In some examples, semiconductor die 16A is first connected to substrate 11 with attachment material 18, semiconductor die 16B is then connected to semiconductor die 16A with attachment material 19 as described previously, semiconductor die 16C is then connected to semiconductor die 16B with attachment material 19, and semiconductor die 16D is then connected to semiconductor die 16C with attachment material 19 to provide stacked semiconductor device structure 160 having offset-stacked shape 161 as illustrated in FIG. 4A.

Figure 4B:
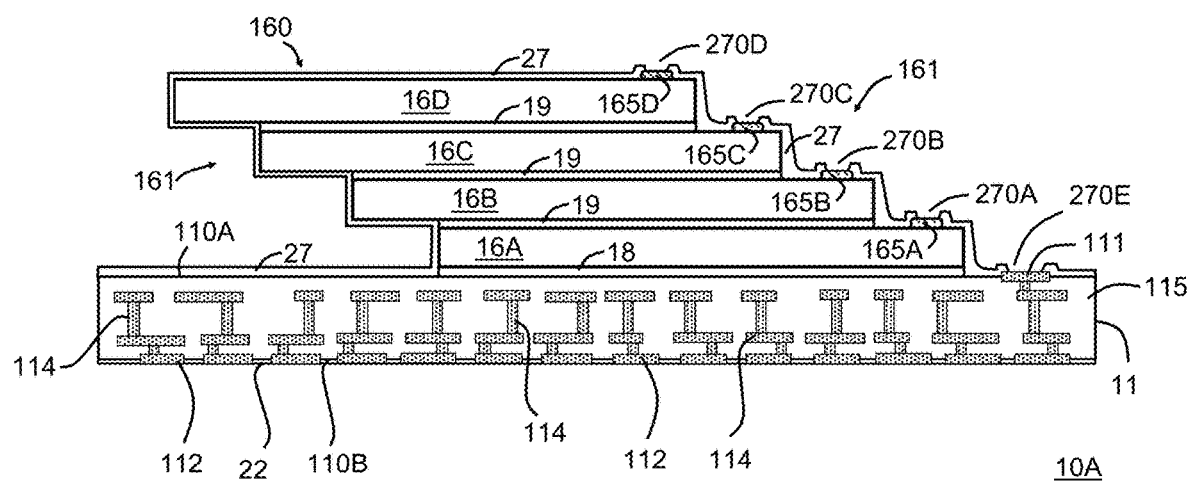

Block 320 of method 300 comprises providing a dielectric layer over the stacked semiconductor device and the substrate, the dielectric layer having openings exposing conductive pads that are part of the stacked semiconductor device structure. For instance, the dielectric layer can be similar to dielectric layer 27 having openings 270A, 270B, 270C, 270D and 270E as illustrated in FIG. 4B. In other examples, dielectric layer 27 can be as described in FIGS. 2B and 2C. Dielectric layer 27 and openings 270A-270E can provided as described previously. As will be described later, in some examples, dielectric layer 27 can be provided on only lateral surface portions of stacked semiconductor device structure 160 where conductive interconnect structures 21 are to be formed or provided.

Figure 4C:
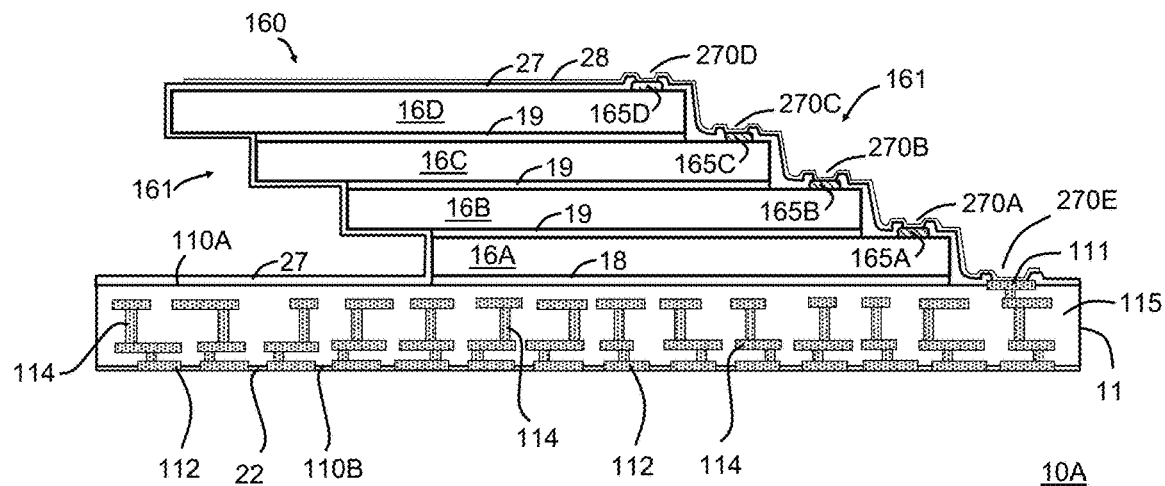

Block S330 of method 300 comprises providing a seed layer over the stacked semiconductor device. For instance, a seed layer 28 can be provided overlying at least portions of dielectric layer 27 proximate to where conductive interconnection structures 21 are to be formed as illustrated in FIG. 4C. In some examples, seed layer 28 provides a starting layer for a subsequent electroplated layer and can be used to establish the texture and grain size of the electroplated layer. In some examples, seed layer 28 comprises a conductive material, such as copper, and can be formed using physical vapor deposition, chemical vapor deposition, and/or atomic layer deposition techniques. In some examples, a thin barrier layer (not shown), such as tantalum or tantalum nitride can be formed prior to forming seed layer 28. In some examples, seed layer 28 can be about 100 nanometers thick and can be patterned after it is formed as generally illustrated in FIG. 4C. In other examples, seed layer 28 covers all exposed surfaces of dielectric layer 27 and is not patterned. As further illustrated in FIG. 4C, seed layer 28 physically contacts conductive pads 165A-165D and 111 through openings 270A-270E respectively.

Figure 4D:
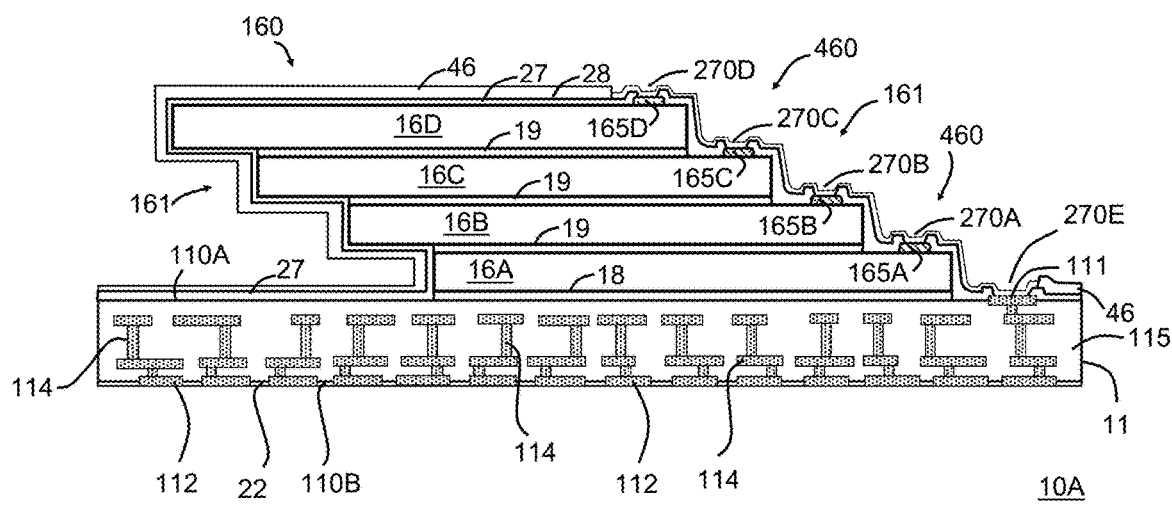

Block S340 of method 300 comprises providing a patterned masking layer over the seed layer. In some examples, a patterned masking layer 46 is provided over seed layer 28 as illustrated in FIG. 4D. In some examples, patterned masking layer 46 comprises a photoresist mask that adheres well to dielectric layer 27 and that is chemically stable for electroplating processes. In some examples, patterned masking layer 46 can comprise a cross-linking negative photoresist having a thickness up to approximately 30 microns. As illustrated in FIG. 4D, patterned masking layer 46 includes one or more openings 460 that corresponds in some examples where conductive interconnect structures, such as conductive interconnect structures 21 are to be formed.

Figure 4E:
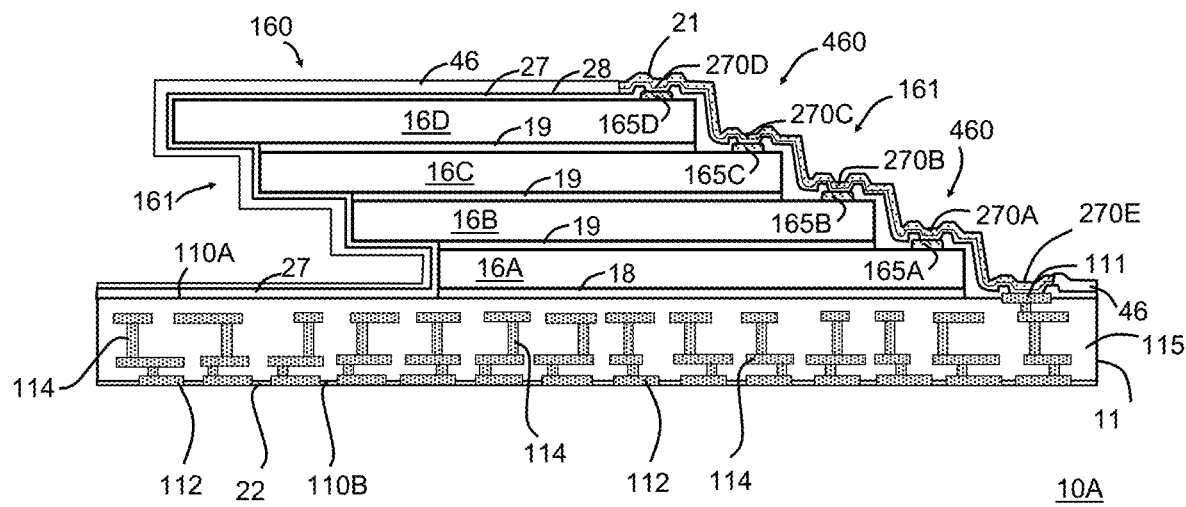

Block S350 of method 300 comprises forming conductive interconnect structures electrically connected to conductive pads on the stacked semiconductor device and the substrate. For instance, conductive interconnect structures 21 can be formed in openings 460 as illustrated in FIG. 4E. In some examples, subassembly 10A can be placed in an electroplating bath and conductive interconnect structures 21 can be formed using an electroplating process with current passing through seed layer 28. In some examples, conductive interconnect structures 21 comprise one or more metals, such as copper or combination of metals including copper. In some examples, conductive interconnect structures 21 have a thickness in a range from about 5 microns to about 25 microns. In other examples, conductive interconnect structures 21 can have a thickness in range from about 20 microns to about 70 microns or more.

Figure 4F:
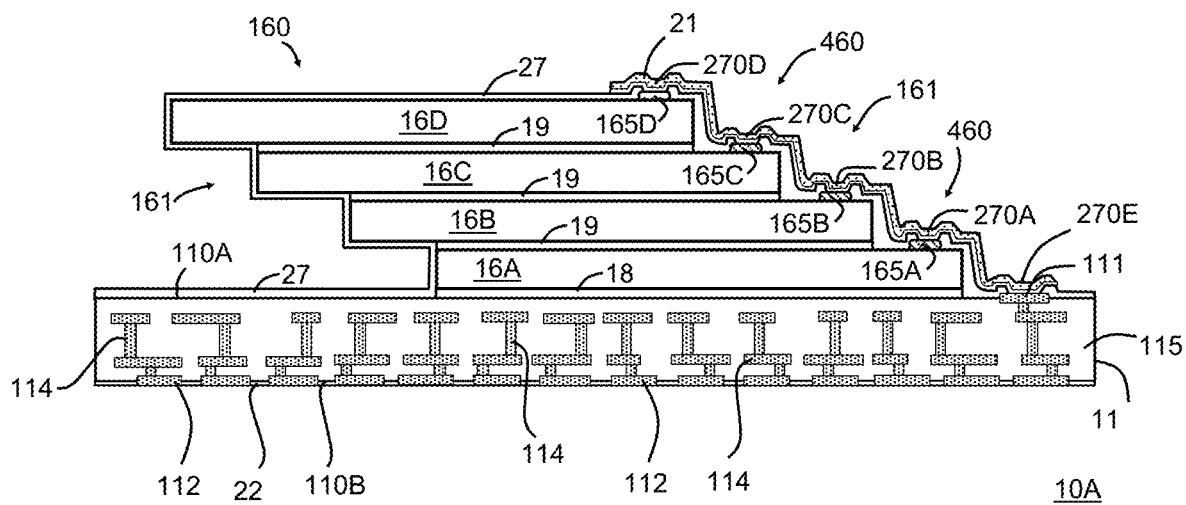

Block S360 of method 300 comprises removing the patterned masking layer and portions of the seed layer covered by the patterned masking layer. In some examples, patterned masking layer 46 can be removed using a photoresist stripping process and portions of seed layer 28 that are exposed after removing patterned masking layer 46 can be removed using an appropriate chemical etchant. In some examples where seed layer 28 comprises copper, the exposed seed layer 28 can be removed using dilute sulfuric acid ($H_2SO_4$) or alkaline soak cleaners. This provides subassembly 10A with conductive interconnect structures 21 electrically connected to conductive pads 165A-165D and 111 as illustrated in FIG. 4F. In some examples, only some of conductive interconnect structures 21 are directly connected to substrate 11

In subsequent steps, package body 36 can be provided to cover stacked semiconductor device structure 160 and portions of substrate 11, and then external interconnects 211 can be attached to conductive pads 112 to provide packaged semiconductor device 10 as illustrated in FIG. 2A. In other examples, external interconnects 211 are not used, and conductive pads 112 can be used to attached packaged semiconductor device 10 is a next level of assembly.

Figure 5:
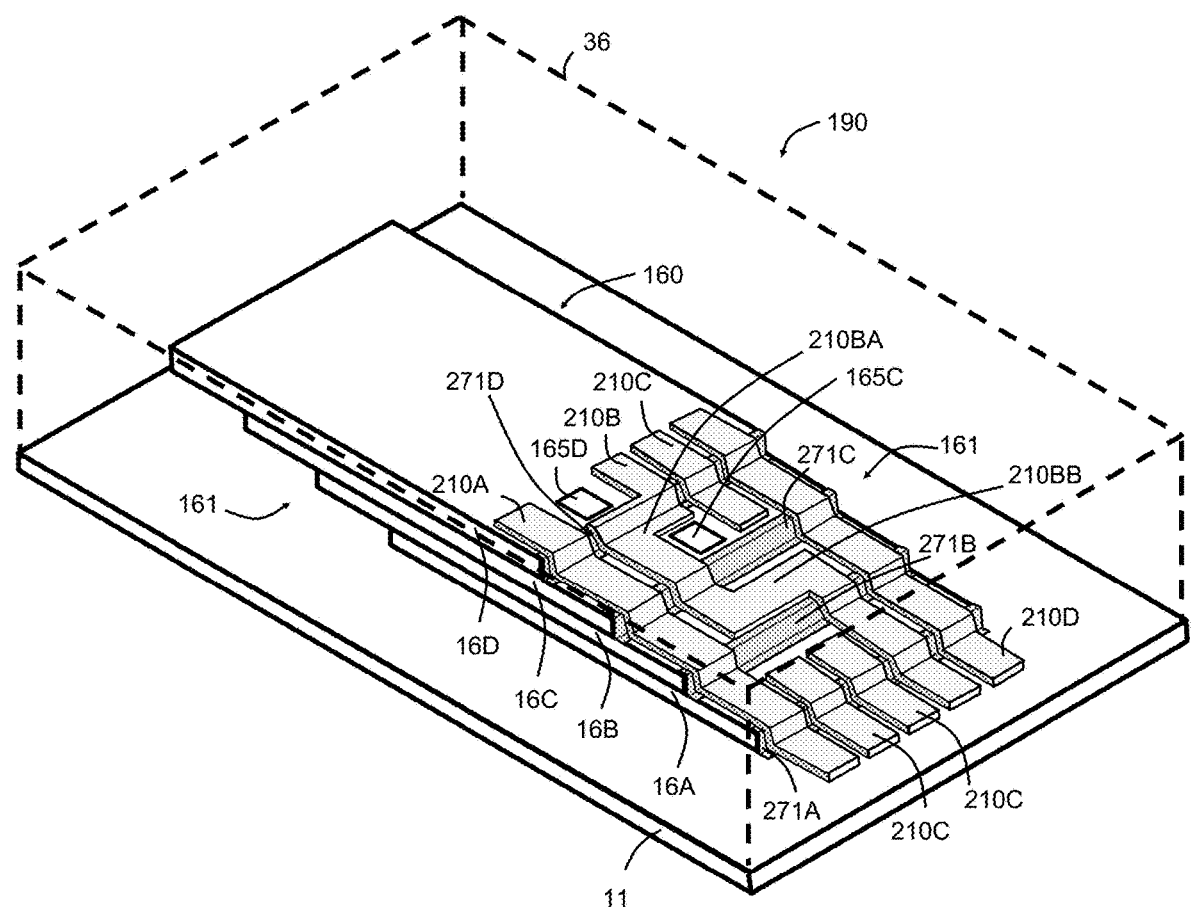
FIG. 5 illustrates a perspective view of a packaged electronic device of the present description.
Figure 6:
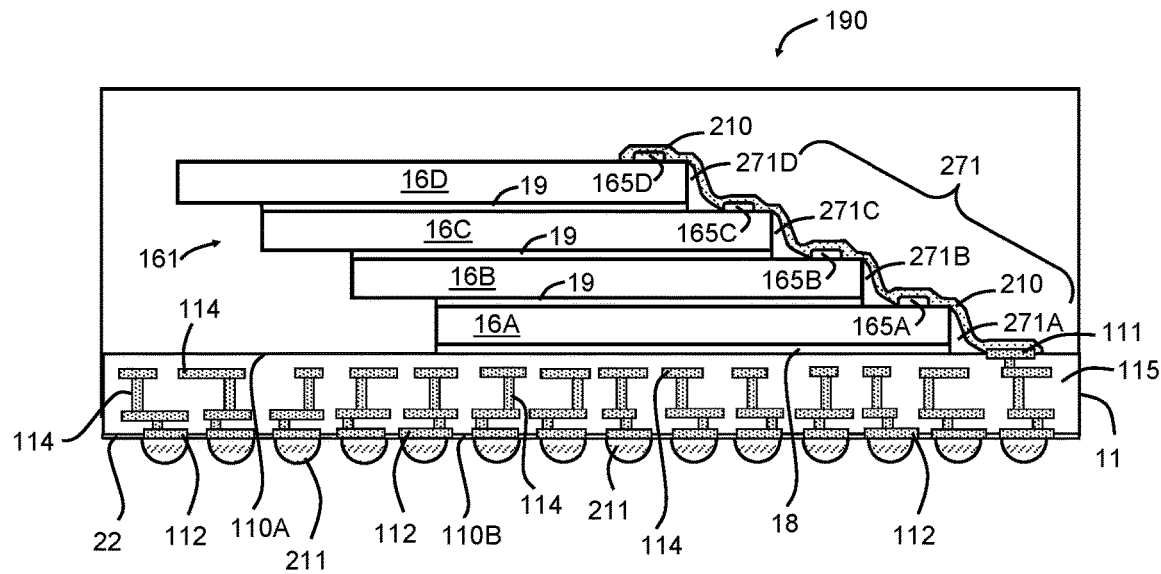
FIG. 6 illustrates a cross-sectional view of a packaged electronic device of the present description.

FIG. 5 illustrates a perspective view of an example packaged electronic device 20, such as a packaged semiconductor device 20 in accordance with the present description. FIG. 6 illustrates a cross-sectional view of packaged semiconductor device 20. Packaged semiconductor device 20 is similar to packaged semiconductor device 10 and only the differences will be described hereinafter.

As illustrated in FIG. 5, conductive interconnect structures 210, such as conductive interconnect structures 210A, 210B, 210C, and 210D comprise at least one interconnect structure that has a different shape compared to the other conductive interconnect structures. In the present example, conductive interconnect structure 210B comprises a nonlinear shape and traverses laterally across one or more top device surfaces of semiconductor die 16A-16D. In the present example, conductive interconnect structure 210B includes a portion 210BA that laterally traverses across portions of top device surfaces of semiconductor die 16C and 16D, and a portion 210BB that laterally traverses across top device surface of semiconductor die 16B. In this way, conductive interconnect structure 210B contacts more than one die terminal on the semiconductor die that are laterally offset and not aligned with respect to each other. Conductive interconnect structure 210B is an example of a conductive interconnect structure that electrically interconnects at least two die terminals or conductive pads 165 within one semiconductor die 16, such as semiconductor die 16B. In addition, conductive interconnect structures 210C comprise conductive interconnect structures that connect a fewer number of die terminals together compared to, for example, conductive interconnect structures 210A, 210B, and 210D. In some examples, conductive interconnect structures 210A-210D can be provided using 3D printing techniques. Although conductive interconnect structures 210A-210D are illustrates as having a more stepped-like shape where they termination on substrate 11, it is understood that conductive interconnect structures 210A-210D can have end portions 216A-216E as described in FIG. 1.

Conductive interconnect structure 210B is an example of a conductive interconnect structure that would be costly to duplicate using conventional interconnect structures, such as wire bonds. More particularly, conductive interconnect structure 210B is configured to electrically connect multiple conductive pads of differing locations within the semiconductor die to facilitate a flexible and reliable interconnect scheme that supports more complex configurations.

One of conductive pads 165D and one of conductive pads 165C are illustrated in FIG. 5 as being exposed from one of conductive interconnect structures 210A-210D. These conductive pads can be left electrically floating or can be interconnected to other conductive structures by throughsilicon vias (TSVs) or by conductive wires. In other examples, a second dielectric layer 27 can be provided over conductive interconnect structures 210B, and a conductive interconnect structure can be used to connect conductive pad 165D to conductive pad 165C. Another difference with packaged semiconductor device 20 is that dielectric structure 271 can be provided as a plurality of dielectric portions 271A, 271B, 271C, and 271D. In some examples, dielectric portions 271A-271D can be provided only adjoining or adjacent to lateral surfaces of semiconductor die 16A-16D to aid the conformal application of interconnect structures 271A-271D on such lateral surfaces, as illustrated in FIGS. 5-6. This is similar to the example illustrate in FIG. 2C. In some examples, dielectric portions 271A-271D are similar to dielectric layer 27 and can be formed by 3D printing or by deposition and patterning techniques. In other examples, dielectric portions 271A-271D may overlap to a small degree the top surfaces of semiconductor die 16A-16D, but dielectric portions 271A-271D do not substantially overlap the major surfaces of semiconductor die 16A-16D. This can be similar to the example illustrate in FIG. 2C.

Figure 7:
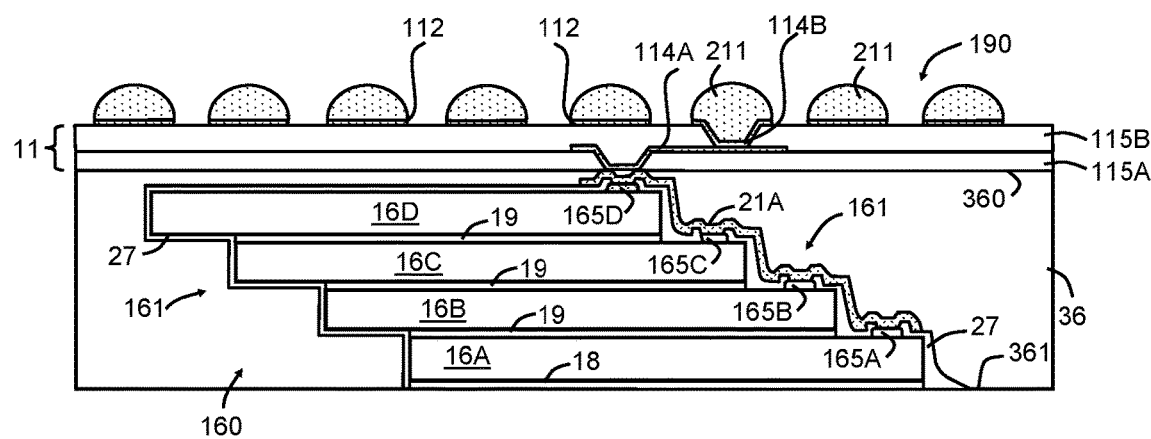
FIG. 7 illustrates a cross-sectional view of a packaged electronic device of the present description.

FIG. 7 illustrates a cross-sectional view of a packaged electronic device 30, such as a packaged semiconductor device 30 in accordance with the present description. Packaged semiconductor device 30 is similar to packaged semiconductor device 10 and only the differences will be described hereinafter. In packaged semiconductor device 30, uppermost semiconductor die 16D of stacked semiconductor device structure 160 is electrically connected to substrate 11.

In packaged semiconductor device 30, substrate 11 is provided as a redistribution layer (RDL) substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a waferlevel substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive redistribution patterns can be formed using a plating process such as, for example, an electroplating process or an electroless plating process. The conductive redistribution patterns can comprise an electrically conductive material such as, for example, copper or other plateable metal. The locations of the conductive redistribution patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this description can also comprise an RDL substrate.

In some examples, substrate 11 can comprise dielectric layers 115A and 115B, conductive layers 114A and 114B, and conductive pads 112. Dielectric layers 115A and 115B can comprise organic materials. In some examples, substrate 11 further includes external interconnects 211. It is understood that in other examples, substrate 11 can comprise additional passivation and conductive layers than those illustrated in the present example.

In the present example, an opening in package body 36 along package body first surface 360 is provided over the conductive interconnect layers, such as conductive interconnect layer 21A as illustrated in FIG. 7, to electrically connect with conductive layer 114A of substrate 11. Other portions of conductive layer 114A can electrically connect with other conductive interconnect layers 21 within packaged semiconductor device 30. In some examples, the opening in package body 36 can be provided by removing portions of package body 36 after it is formed to expose conductive interconnect structures 21 proximate to semiconductor die 16D. This can include masking and etching techniques, grinding techniques, polishing techniques, or other removal techniques as known to one of ordinary skill in the art. In other examples, film assist molding can be used to expose conductive interconnect structures 21 through first surface 360 of package body 36. In further embodiments, a heat removal structure, such as a heat sink (not shown) can be attached to semiconductor die 16A exposed through package body second surface 361. In other examples, substrate 11 in packaged semiconductor device 30 can be a laminate type substrate.

Figure 8:
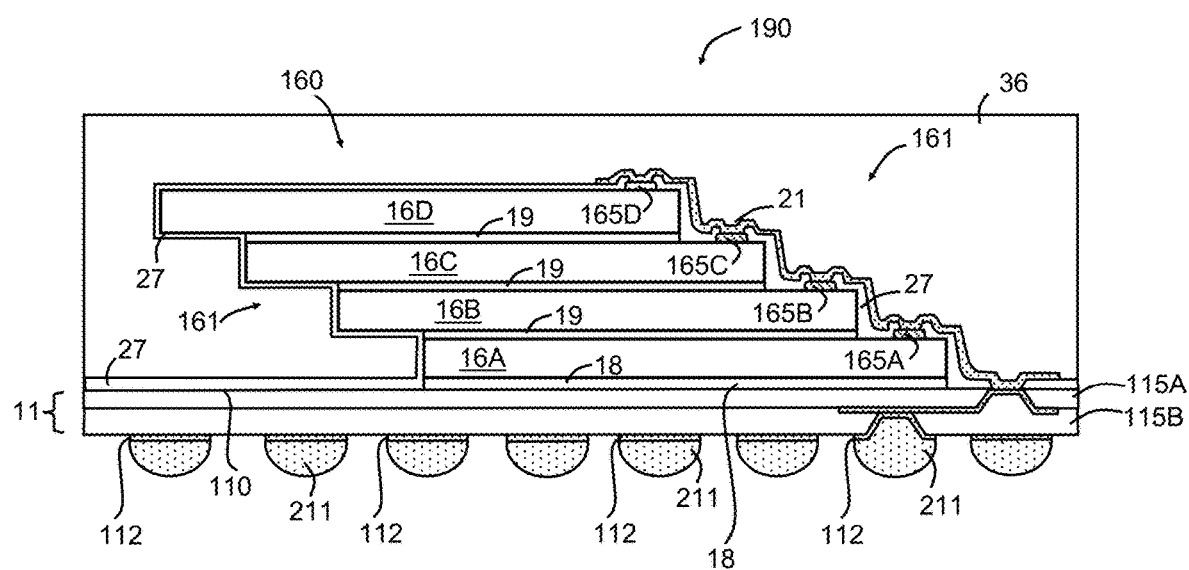
FIG. 8 illustrates a cross-sectional view of a packaged electronic device of the present description.

FIG. 8 illustrates a cross-sectional view of a packaged electronic device 40, such as a packaged semiconductor device 40 in accordance with the present description. Packaged semiconductor device 40 is similar to packaged semiconductor devices 10 and 30 and uses substrate 11 configured as an RLD type substrate with semiconductor die 16A attached to top substrate surface 110A of substrate 11.

Figure 9A:
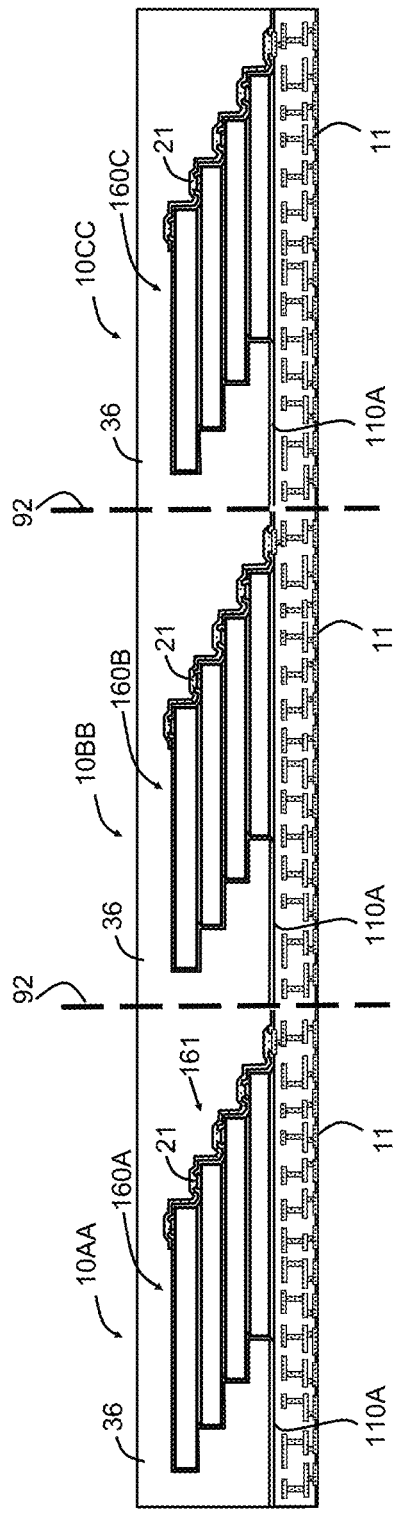
FIGS. 9A, 9B, and 9C illustrate partial cross-sectional views of a plurality of packaged electronic devices of the present description at various steps in fabrication.
Figure 9B:
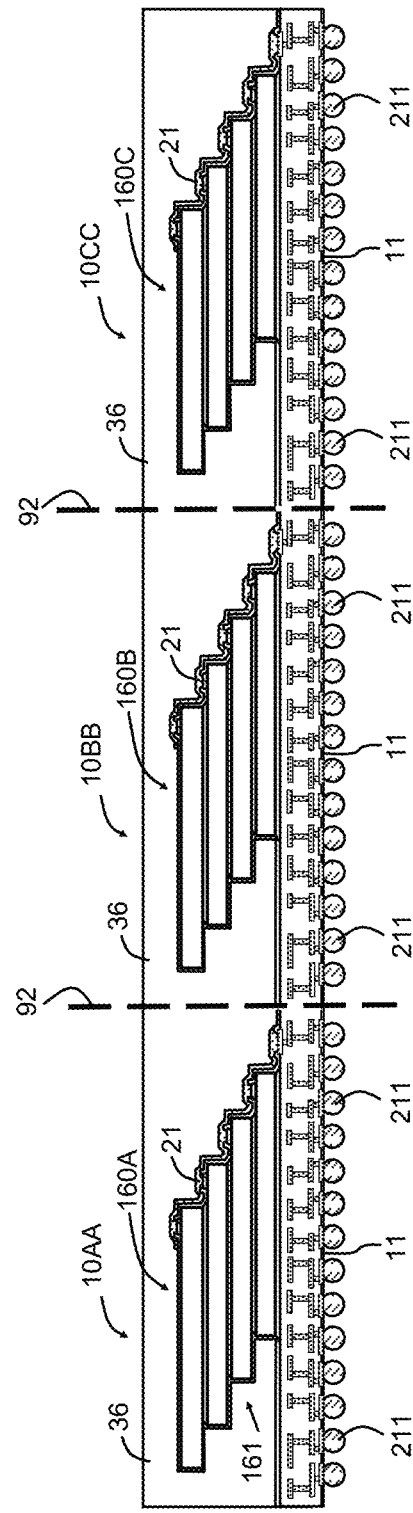
Figure 9C:
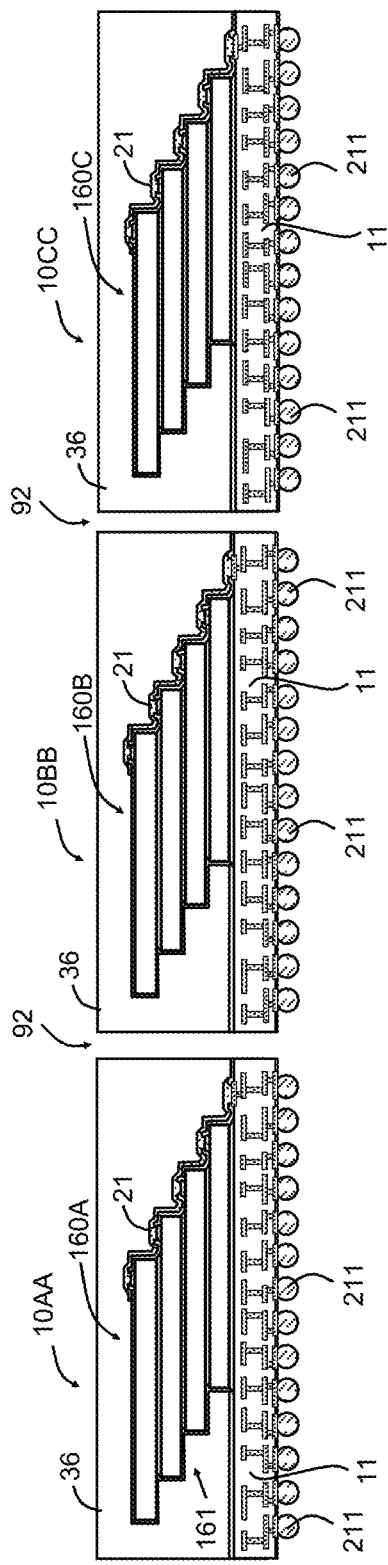

FIGS. 9A, 9B, and 9C illustrate partial cross-sectional views of a plurality of packaged electronic devices, such as packaged semiconductor devices 10AA, 10BB, and 10CC at various steps in fabrication in accordance with the present description. In some examples, packaged semiconductor devices 10AA, 10BB, and 10CC are similar to packaged semiconductor device 10 illustrated in FIGS. 1, 2, and 4A to 4F, and are provided to illustrate a method of forming package body 36 and other subsequent processing steps after stacked semiconductor devices 160 are attached to substrate 11, and after conductive connective structures 21 have been formed to electrically connect the semiconductor die and/or the substrate together. For ease of understanding, fewer elements are labeled in FIGS. 9A, 9B, and 9C to not overly complicate the description. The details of the individual elements are illustrated, for example, in FIGS. 1, 2, and 4A to 4F.

FIG. 9A illustrates packaged semiconductor devices 10AA, 10BB, and 10CC attached to substrate 11, which can be provided as an N by M matrix of multiple substrates 11 (where N and/or M can be ≥2). In the present example, package body 36 is provided as an overmolded package body that covers each of the stacked semiconductor device structures 160A, 160B, and 160C and top substrate surface 110A of substrate 11. In other examples, multiple or individual package bodies 36 can be provided using cavity molding techniques. Dashed lines 92 represent singulation lines 92 or separation lines 92 where packaged semiconductor devices 10AA, 10BB, and 10CC are to be separated later into individual packaged semiconductor devices.

FIG. 9B illustrates packaged semiconductor devices 10AA-10CC after additional processing. In some examples, external interconnects 211, such as solder balls or solder bumps 211 are attached to conductive pads (for example, conductive pads 112 illustrated in FIG. 2A) on substrate 11. In some examples, a flux material is provided on the conductive pads, external interconnects 211 are attached to the flux material, the external interconnects 211 are heated to reflow the external interconnects 211, and then the subassembly can be cleaned to remove the flux material. In other examples, external interconnects 211 can provided using screen printing, plating or solder paste processes. In further examples, external interconnects 211 are not used and the conductive pads or lands 112 of substrate 11 can be used for attached the packaged semiconductor devices to a next level of assembly.

FIG. 9C illustrates packaged semiconductor devices 10AA-10CC after further processing. In some examples, a singulation or separation process is used to singulate or separate through package body 36 and substrate 11 proximate to singulation lines 92 to provide the packaged semiconductor devices 10AA-10CC as individual devices. In some examples, sawing or laser cutting techniques can used to separate the devices. Packaged semiconductor devices 10AA-10CC are examples of packaged structures having face-up stacked semiconductor devices 160A-160C (i.e., active surface of at least semiconductor die 16D faces away from substrate 11), substrates 11 configured as laminate substrates, and conductive interconnect structures 21 comprising conformal layer structures that interconnect the stacked semiconductor die and the respective substrate 11.

FIGS. 10A, 10B, 10C, and 10D illustrate partial cross-sectional views of a plurality packaged electronic devices 40, such as packaged semiconductor devices 40A, 40B, and 40C at various steps in fabrication in accordance with the present description. In some examples, packaged semiconductor devices 40A, 40B, and 40C are similar to packaged semiconductor device 40 illustrated in FIG. 8 and are provided to illustrate an example method of forming packaged semiconductor devices 40. For ease of understanding, fewer elements are labeled in FIGS. 10A, 10B, 10C, and 10D to not overly complicate the description. More details of the of individual elements are illustrated, for example, in FIG. 8.

FIG. 10A illustrates packaged semiconductor devices 40A, 40B, and 40C attached to a carrier substrate 511. In some examples, carrier substrate 511 comprises a rigid material configured to support stacked semiconductor devices 160A, 160B, and 160C during the assembly process. In some examples, carrier substrate 511 can comprise a metal plate, a ceramic substrate, a glass substrate, a semiconductor substrate, or other types of substrates as known to one of ordinary skill in the art. In some examples, stacked semiconductor devices 160A, 160B, and 160C are attached to a top surface of carrier substrate 511 using, for example, attachment material 18 as described previously. In other examples, different attachment materials can be used, such as UV release adhesives. In some examples, dielectric layer 27 can be provided over top substrate surface 512 of carrier substrate 511 as illustrated in FIG. 10A. In some examples, conductive interconnect structures 21 are provided after stacked semiconductor devices 160A, 160B, and 160C are attached to carrier substrate 511.

In the present example, package body 36 is provided as an overmolded package body that covers each of the stacked semiconductor device structures 160A, 160B, and 160C and top substrate surface 512 of carrier substrate 511. In other examples, multiple or individual package bodies 36 can be provided using cavity molding techniques. Dashed lines 92 represent singulation lines 92 or separation lines 92 where packaged semiconductor devices 40A, 40B, and 40C can be separated later into individual packaged semiconductor devices.

Figure 10C:
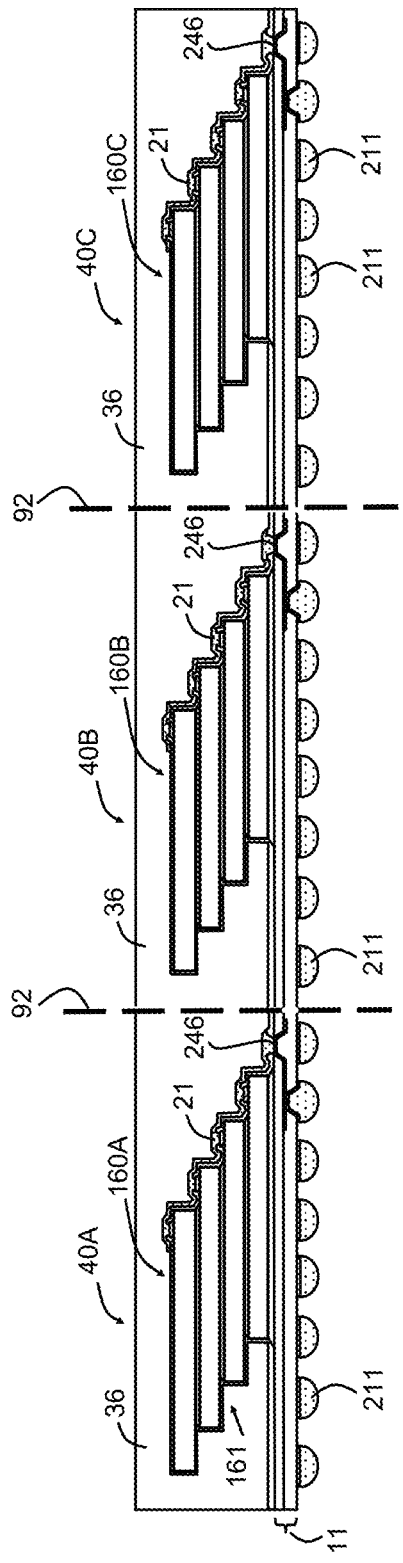

FIG. 10B illustrates packaged semiconductor devices 40A-40C after additional processing. In some examples, carrier substrate 511 is removed to expose a portion 246 of conductive interconnect structures 21 through a bottom surface of package body 36. In some examples, heat and/or solvents can be used to remove carrier substrate 511. In subsequent steps, substrate 11 configured as an RDL type substrate is formed adjacent to the bottom surface of package body 36 including, for example, external interconnects 211, as illustrated in FIG. 10C. In some examples, substrate 11 comprises multiple layers of dielectrics and conductors. Portions of the conductors of substrate 11 are electrically connected to conductive interconnect structures 21 at portions 246 as generally illustrated in FIG. 10C.

Figure 10D:
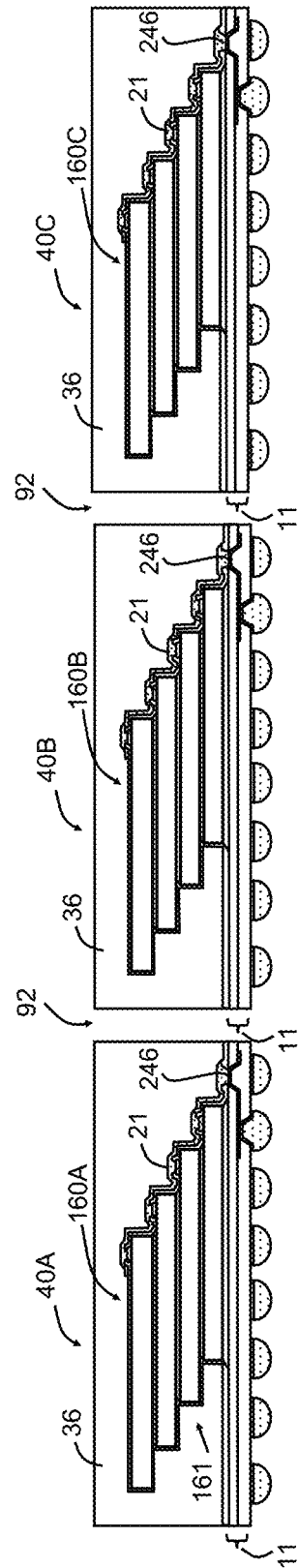

FIG. 10D illustrates packaged semiconductor devices 40A-40C after further processing. In some examples, a singulation or separation process is used to separate through package body 36 and substrate 11 proximate to singulation lines 92 to provide the packaged semiconductor devices 40A-40C as individual devices. In some examples, sawing or laser cutting techniques can used to separate the devices. Packaged semiconductor devices 40A-40C are examples of packaged semiconductor devices having face-up stacked semiconductor devices 160A-160C (i.e., active surface of at least semiconductor die 16D faces away from substrate 11), substrates 11 configured as RDL type substrates, and conductive interconnect structures 21 comprising conformal layer structures that interconnect the semiconductor die and the respective substrates 11.

FIGS. 11A, 11B, 11C, and 11D illustrate partial cross-sectional views of packaged semiconductor devices 40A, 40B, and 40C at various steps of fabrication in accordance with the present description. FIGS. 11A-11D are similar to FIGS. 10A-10D, and only the differences will be described hereinafter.

Figure 11A:
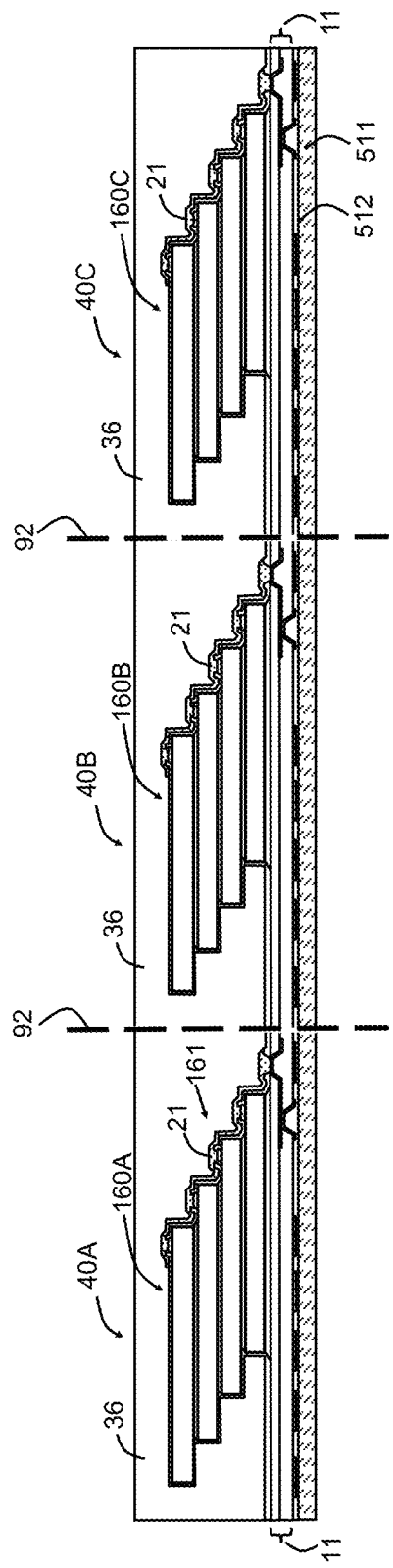

In FIG. 11A, substrate 11 is configured as an RLD type substrate and can be provided on top surface 512 of carrier substrate 511. Stacked semiconductor devices 160A-160C then can be attached to substrate 11 and conductive interconnect structures 21 formed to electrically connect the semiconductor die together and to substrate 11. Package body 36 can then be provided as an overmolded package body that covers the stacked semiconductor devices 160A-160C and portions of substrate 11 as illustrated in FIG. 11A.

Figure 11B:
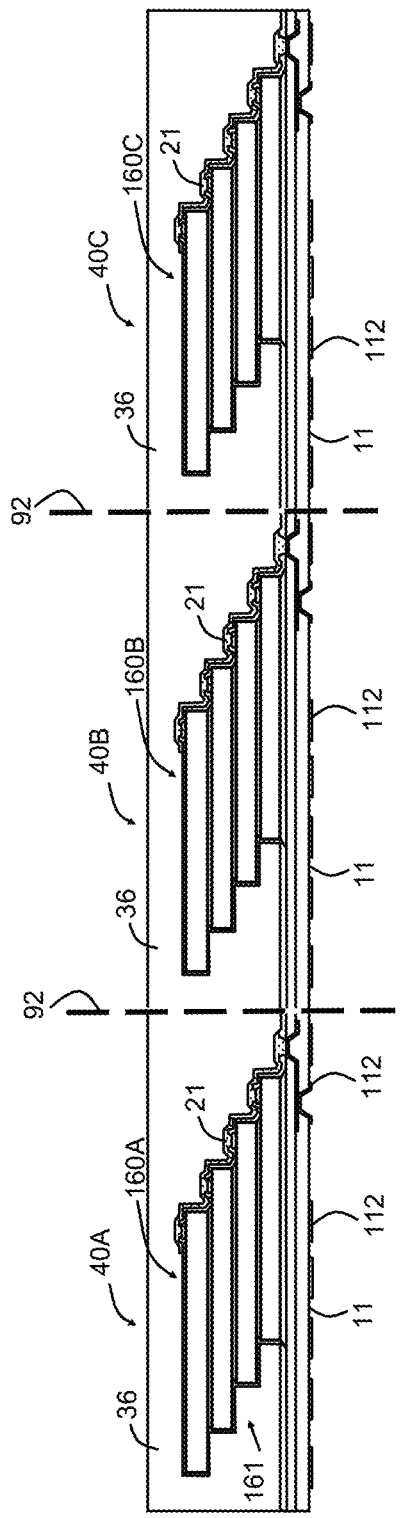

Carrier substrate 511 can then be removed to expose substrate 11 including for examples, conductive pads 112 for further processing as illustrated in FIG. 11B. Next, external interconnects 211 can be attached to conductive pads as described previously. Finally, a singulation or separation process is used to separate through package body 36 and substrate 11 proximate to singulation lines 92 to provide the packaged semiconductor devices 40A-40C as individual devices. In some examples, sawing or laser cutting techniques can used to separate the devices. Packaged semiconductor devices 40A-40C are examples of packaged semiconductor devices having face-up stacked semiconductor devices 160A-160C (i.e., active surface at least semiconductor die 16D faces away from substrate 11), substrates 11 configured as RDL substrates, and conductive interconnect structures 21 comprising conformal layer structures that interconnect the semiconductor die and the respective substrates 11.

Figure 12C:
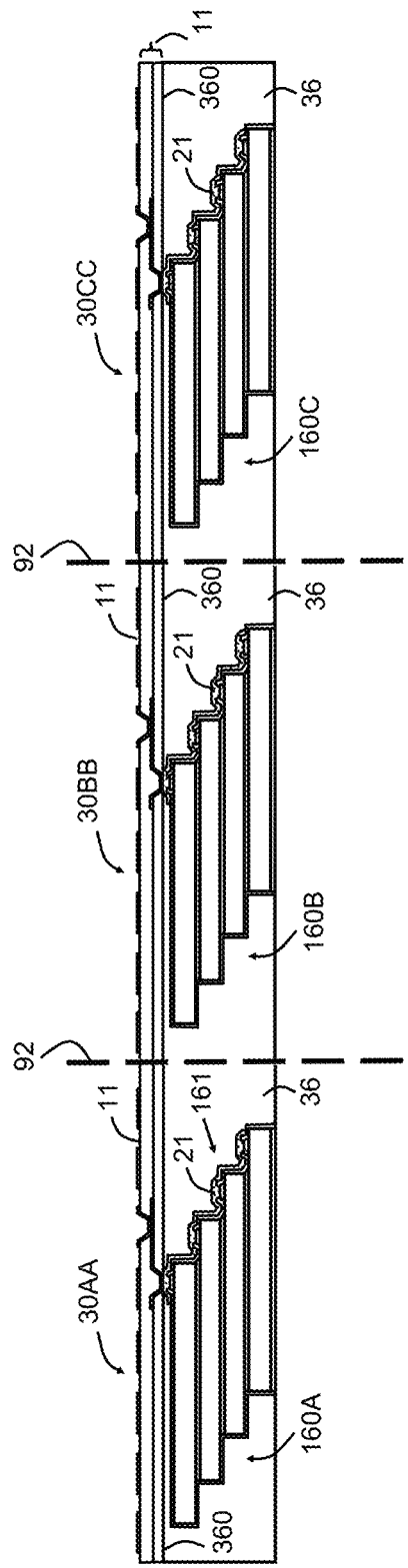

FIGS. 12A, 12B, 12C, and 12D illustrate partial cross-sectional views of a plurality of packaged electronic devices, such as packaged semiconductor devices 30AA, 30BB, and 30CC at various steps of fabrication in accordance with the present description. In some examples, packaged semiconductor devices 30AA, 30BB, and 30CC are similar to packaged semiconductor device 10 illustrated in FIG. 7. As shown in FIG. 12A, stacked semiconductor devices 160A, 160B, and 160C are attached to top surface 512 of carrier substrate 511 using, for example, attachment material 18. Conductive interconnect structures 21 are formed to electrically connect the semiconductor die together and to substrate 11.

In some examples, package body 36 is then provided as an overmolded package body that covers each of the stacked semiconductor device structures 160A, 160B, and 160C and top substrate surface 110 of substrate 11 as generally illustrated in FIG. 12A. In other examples, multiple or individual package bodies 36 can be provided using cavity molding techniques.

FIG. 12B illustrates packaged semiconductor devices 30AA-30CC after additional processing. In some examples, packaged body 36 is reduced in thickness such that a portion of conductive interconnect structures 21 are exposed through first surface 360 of package body 36. In some examples, a portion of package body 36 is removed using etching, grinding, polishing, combinations thereof, or other removal techniques as known to one of ordinary skill in the art. In other examples, film assist molding techniques can be used to expose conductive interconnect structures 21 through first surface 360 of package body 36.

Next, substrate 11 is attached or formed over first surface 360 of package body 36. In some examples, substrate 11 is configured as an RDL-type substrate as illustrated in FIG. 12C and comprises multiple passivation layers and conductive layers. Substrate 11 is electrically connected to conductive interconnect structures 21 adjacent to first surface 360 as illustrated in FIG. 12. In other examples, substrate 11 can be other types of substrates including laminate substrates as illustrated, for example, in FIG. 9A. Carrier substrate 511 can be removed before or after substrate 11 is provided over first surface 360. In other examples, carrier substrate 511 can be removed after package body 36 is formed and before substrate 11 is provided.

Figure 12D:
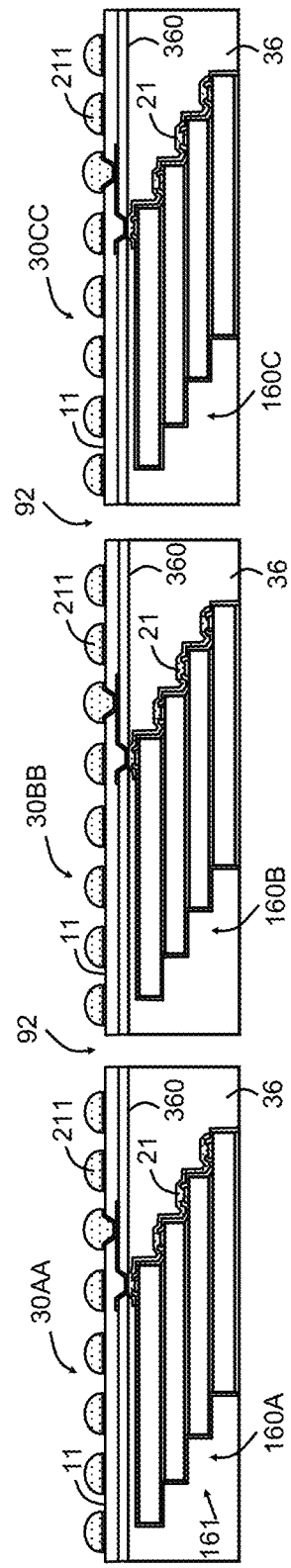

FIG. 12D illustrates packaged semiconductor devices 30AA-30CC after further processing. In some examples, external interconnects 211 are attached to substrate 11, and then a singulation or separation process is used to separate through package body 36 and substrate 11 proximate to singulation lines 92 to provide the packaged semiconductor devices 30AA-30CC as individual devices. In some examples, sawing or laser cutting techniques can used to separate the devices. Packaged semiconductor devices 30AA-30CC are examples of structures having face-down stacked semiconductor devices 160A-160C (i.e., active surface of at least semiconductor die 16A faces substrate 11), substrates 11 configured as RDL type substrates, and conductive interconnect structures 21 comprising conformal layer structures that interconnect the semiconductor devices and the respective substrates 11.

FIGS. 13, 14, 15, 16 and 17 illustrate examples of package-in-package (PIP) type devices using a plurality of packaged semiconductor devices of the present description. Such packaged semiconductor devices can include combinations of packaged semiconductor devices 10, 20, 30, and/or 40 as well as others, which include stacked semiconductor device structures 160 or a single semiconductor die having conductive interconnect structures 21 provided as conformal layers that substantially follow the profile of stacked semiconductor device structures 160 or the profile of the single semiconductor die. Although the following examples illustrate substrates 611 as laminate type substrates, it is understood that substrate 611 can be selected from common circuit boards (for example, rigid circuit boards and flexible circuit boards), multi-layer substrates, core substrates with build-up layers, coreless substrates, ceramic substrates, lead frame substrates, molded lead frame substrates, or similar substrates as known to one of ordinary skill in the art. In this regard, the present description is not intended to be limited to any particular type of substrate.

Figure 13:
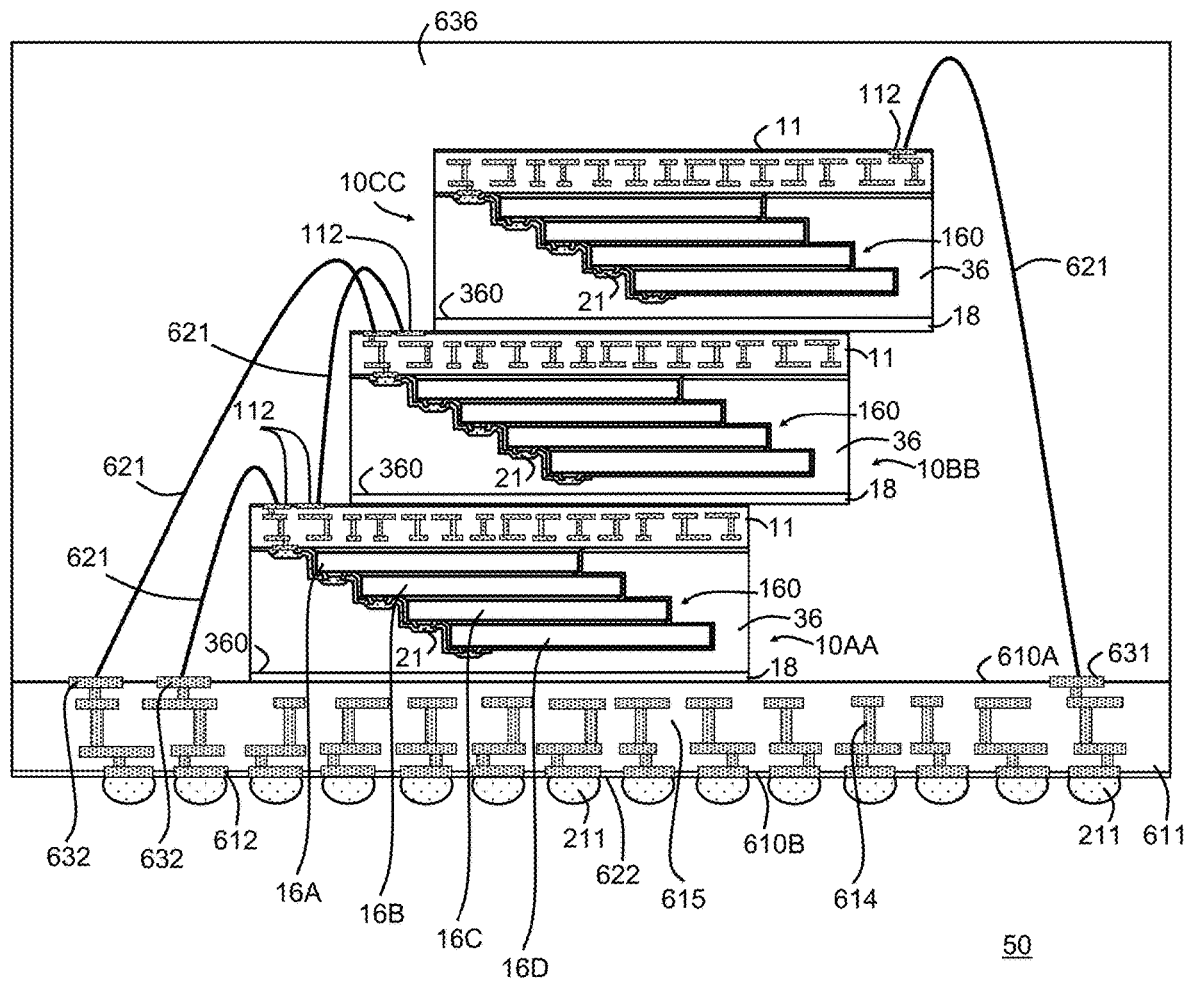
FIG. 13 illustrates a packaged electronic device of the present description.

FIG. 13 illustrates a cross-sectional view of a packaged electronic device 50, such as a packaged semiconductor device 50 in accordance with the present description. In the present example, packaged semiconductor device 50 is configured as PIP type packaged semiconductor device comprising a plurality of packaged semiconductor devices each having a single semiconductor die or having stacked semiconductor die (e.g., stacked semiconductor device structures 160) interconnected and/or connected to a substrate with conductive interconnect structures 21. In the present example, packaged semiconductor device 50 comprises a plurality of packaged semiconductor devices 10 (for example, 10AA, 10BB, and 10CC) as previously described in, for example, FIGS. 1, 2 and 9A-9C. In some examples, external interconnects 211 are not used with packaged semiconductor devices 10AA-10CC as illustrated in FIG. 13.

Packaged semiconductor device 50 includes a substrate 611, which can be similar to substrate 11. In some examples, substrate 611 can be provided with conductive pads 631 proximate to substrate top surface 610A, which can be further connected through conductive layers/structures 614 within substrate 611 to conductive pads 612 or conductive lands 612 proximate to a substrate bottom surface 610B. Substrate 611 further includes a dielectric or passivation structure 615 comprising one or more dielectric layers. Substrate 611 can be further provided a solder mask structure 622 proximate to substrate bottom surface 610B between conductive lands 612. In some examples, external interconnects 211 can attached to conductive lands 612, and can comprise conductive materials, such as solder balls, solder bumps, copper bumps, nickel gold bumps, or similar materials as known to one of ordinary skill in the art. In other examples, conductive lands 612 can be configured to directly connect or attach to a next level of assembly, such as a printed circuit board.

In some examples, packaged semiconductor device 10AA is attached to substrate top surface 610A with an attachment material, such as attachment material 18 described previously. As illustrated in FIG. 13, packaged semiconductor device 10AA is attached in a face-down orientation (i.e., active surface of at least semiconductor die 16D faces towards substrate 611) so that top surface 360 of package body 36 is adjacent to substrate top surface 610A. In this orientation, substrate 11 of packaged semiconductor device 10AA, which can be a laminate type substrate, is spaced apart from or is distal to substrate top surface 610A.

In accordance with the present example, packaged semiconductor device 10AA is electrically connected to substrate 611. For example, one or more of conductive lands 112 on substrate 11 of packaged semiconductor device 10AA are electrically connected to conductive pads 632 on substrate 611. In some examples, conductive interconnect structures 621 are used to electrically connect packaged semiconductor device 10AA to substrate 611. By way of example, conductive interconnect structures 621 can comprise conductive wires provided using a wire bonding process or similar structures as known to one of ordinary skill in the art.

Packaged semiconductor device 10BB is attached to substrate 11 of packaged semiconductor device 10AA using an attachment material, such as attachment material 18 described previously. In some examples, top surface 360 of package body 36 of packaged semiconductor device 10BB is attached to substrate 11 of packaged semiconductor device 10AA in a face-down orientation. In accordance with the present description, packaged semiconductor device 10BB is attached to packaged semiconductor device 10AA in a laterally offset configuration so as to expose one or more conductive lands 112 on substrate 11 of packaged semiconductor device 10AA. In some examples, substrate 11 of packaged semiconductor device 10BB is electrically connected to substrate 611 with one or more conductive interconnect structures 621. In some examples, one or more conductive interconnect structures 621 can electrically connect packaged semiconductor device 10BB and packaged semiconductor device 10AA together as generally illustrated in FIG. 13.

Packaged semiconductor device 10CC is attached to substrate 11 of packaged semiconductor device 10BB using an attachment material, such as attachment material 18 described previously. In some examples, top surface 360 of package body 36 of packaged semiconductor device 10CC is attached to substrate 11 of packaged semiconductor device 10BB in a face-down orientation. In accordance with the present description, packaged semiconductor device 10CC is attached to packaged semiconductor device in a laterally offset configuration so as to expose one or more conductive lands 112 on substrate 11 of packaged semiconductor device 10BB. In some examples, substrate 11 of packaged semiconductor device 10CC is electrically connected to substrate 611 with one or more conductive interconnect structures 621. It is understood that one or more of packaged semiconductor devices 10AA, 10BB, and/or 10CC can be rotated 180 degrees about a horizontal plane with respect to other ones of packaged semiconductor devices 10AA, 10BB, and/or 10CC. Also, packaged semiconductor device 10CC can be electrically connected to one or more of packaged semiconductor device 10AA and 10BB with conductive interconnect structures, such as conductive interconnect structures 621. In some examples, packaged semiconductor devices 10AA, 10BB, and 10CC (or any of the packaged semiconductor devices described herein) are attached to substrate 611 and to each other before conductive interconnect structures 621 are provided.

Packaged semiconductor device 50 further includes a package body 636 covering packaged semiconductor devices 10AA, 10BB, and 10CC as well as substrate top surface 610A and conductive interconnect structures 621. In some examples, package body 636 can be a polymer based composite material, such as epoxy resin with filler, epoxy acrylate with filler, or polymer with proper filler. Package body 636 comprises a non-conductive and environmentally protective material that protects substrate 611 and conductive interconnect structures 621 from external elements and contaminants. Package body 636 may be formed using paste printing, compressive molding, transfer molding, overmolding, liquid encapsulant molding, vacuum lamination, other suitable applicator, or other processes as known to those of skill in the art. In some embodiments, package body 636 is an epoxy mold compound ("EMC") and can be formed using transfer or injection molding techniques. In other examples, package body 636 can be omitted.

Packaged semiconductor device 50 is an example of a PIP type semiconductor package having multiple-sided wire bond interconnects. That is, conductive interconnect structures 621 are disposed on more than one side of packaged semiconductor devices 10AA, 10BB, and 10CC as illustrated in FIG. 13. In other examples, packaged semiconductor device 10CC can be electrically connected to substrate 611 on the same side of substrate 611 as packaged semiconductor device 10AA and 10BB to provide a single-sided wire bond interconnect configuration. Similar to the formation of packaged semiconductor devices 10AA, 10BB, and 10CC as described previously in conjunction with FIGS. 9A to 9C, packaged semiconductor device 50 can be formed using a matrix of substrates 611 and an overmolded packaged body 636, which can be singulated after package body 636 is formed to provide a plurality of packaged semiconductor devices 50.

Figure 14:
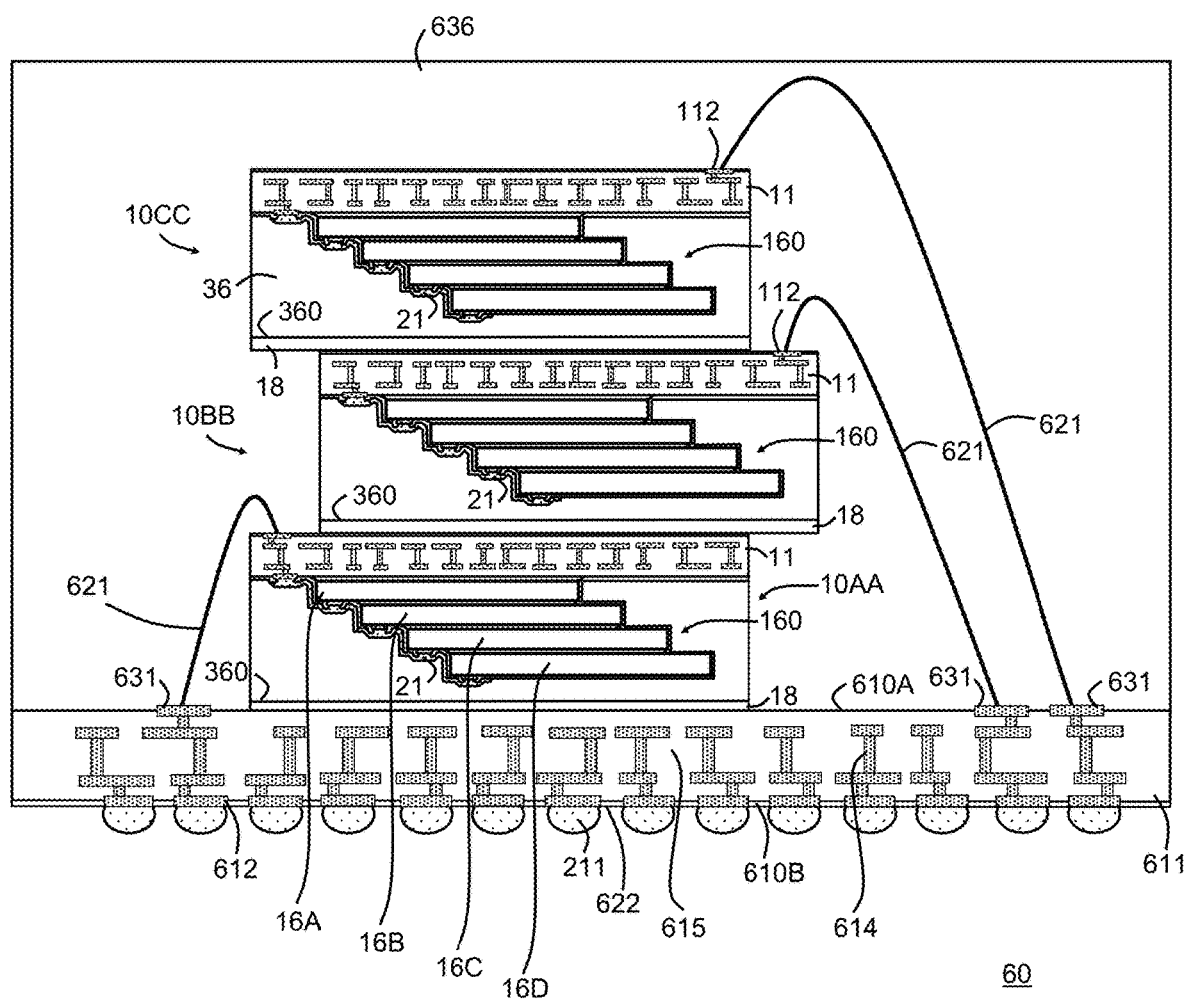
FIG. 14 illustrates a packaged electronic device of the present description.

FIG. 14 illustrates a cross-sectional view of a packaged electronic device 60, such as a packaged semiconductor device 60 in accordance with the present description. In the present example, packaged semiconductor device 60 is configured as a PIP type semiconductor device comprising a plurality of packaged semiconductor devices each having a single semiconductor die or having stacked semiconductor die (e.g., stacked semiconductor devices 160) interconnected and/or connected to a substrate with conductive interconnect structures 21. Packaged semiconductor device 60 is similar to packaged semiconductor device 50, and only the differences will be described hereinafter.

In packaged semiconductor device 60, packaged semiconductor device 10CC is laterally offset from packaged semiconductor device 10BB so as to be substantially aligned with packaged semiconductor device 10AA. In addition, packaged semiconductor device 10BB is electrically connected to substrate 611 using, for example, conductive interconnect structure 621 on the same side as packaged electronic device 10CC. Packaged semiconductor device 60 is an example of a PIP type semiconductor package having multiple-sided wire bond interconnects. That is, conductive interconnect structures 621 are disposed on more than one side of packaged semiconductor devices 10AA, 10BB, and 10CC as illustrated in FIG. 14.

Figure 15:
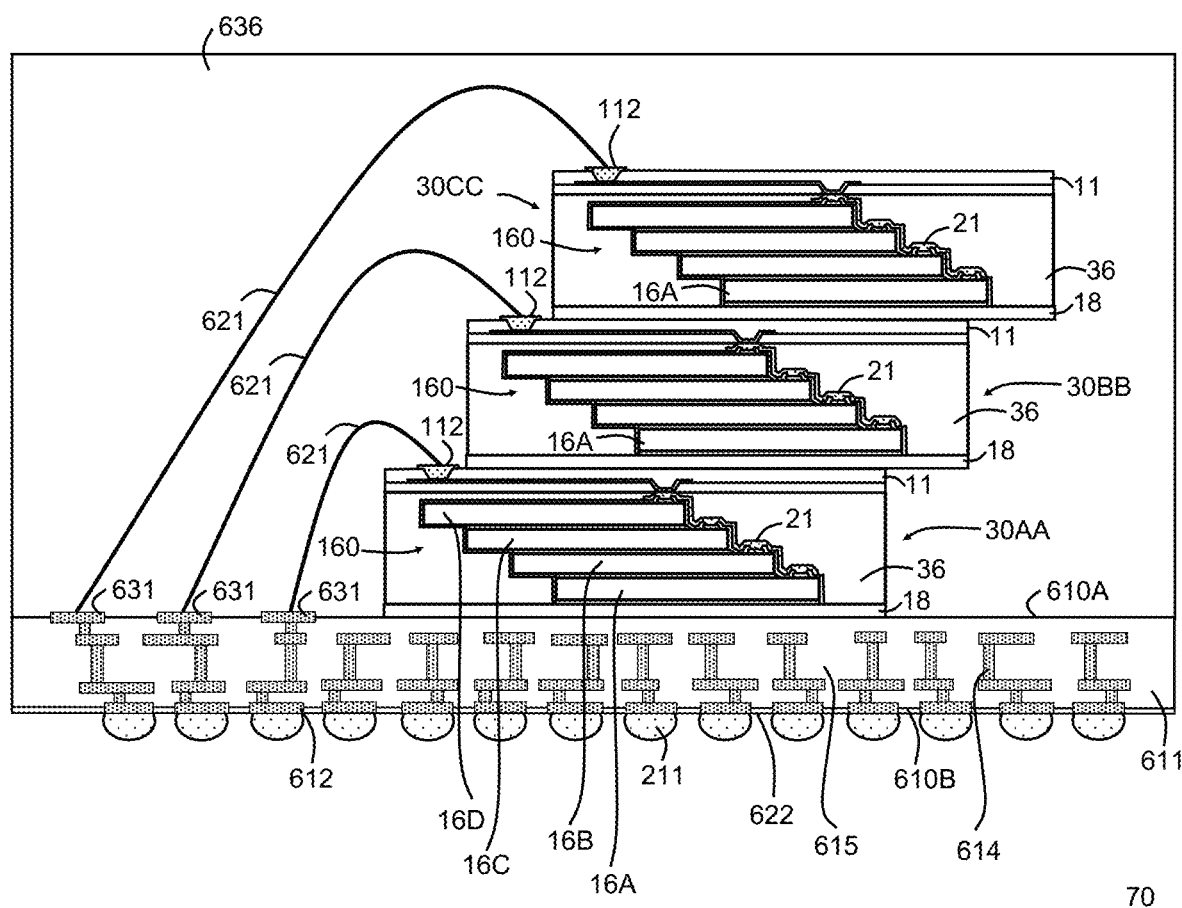
FIG. 15 illustrates a packaged electronic device of the present description.

FIG. 15 illustrates a cross-sectional view of a packaged electronic device 70, such as a packaged semiconductor device 70 in accordance with the present description. In the present example, packaged semiconductor device 70 is configured as a PIP type semiconductor device comprising a plurality of packaged semiconductor devices each having a single semiconductor die or having stacked semiconductor die (e.g., stacked semiconductor device structures 160) interconnected and/or connected to a substrate with conductive interconnect structures 21. In the present example, packaged semiconductor device 70 comprises a plurality of packaged semiconductor devices 30 (for example, 30A, 30B, and 30C) as previously described in FIGS. 7 and 12A-12D. In some examples, external interconnects 211 are not used with packaged semiconductor devices 30A-30C as illustrated in FIG. 15.

Packaged semiconductor device 30AA is attached to substrate top surface 610A of substrate 611 with an attachment material, such as attachment material 18 described previously. As illustrated in FIG. 15, packaged semiconductor device 30AA is attached in a face-up orientation (i.e., active surface of at least semiconductor die 16A faces away from substrate 611) so that semiconductor die 16A of packaged semiconductor device 30AA is adjacent to substrate top surface 610A. In this orientation, substrate 11 of packaged semiconductor device 30AA, which can be configured as an RDL type substrate, is spaced apart from or is distal to substrate top surface 610A. In accordance with the present example, packaged semiconductor device 30AA is electrically connected to substrate 611 using, for example, one or more conductive interconnect structures 621, which can comprise, for example, conductive wires formed using a wire bonding process.

Packaged semiconductor device 30BB is attached to substrate 11 of packaged semiconductor device 30AA using an attachment material, such as attachment material 18 described previously. In some examples, packaged semiconductor device 30BB is attached so that at least semiconductor die 16A of packaged semiconductor device 30BB is proximate to substrate 11 of packaged semiconductor device 30AA in a face-up orientation (i.e., faces away from packaged semiconductor device 30AA). In accordance with the present description, packaged semiconductor device 30BB is attached to packaged semiconductor device 30AA in a laterally offset configuration so as to expose one or more conductive lands 112 on substrate 11 of packaged semiconductor device 30AA. Substrate 11 of packaged semiconductor device 30BB is electrically connected to substrate 611 with one or more conductive interconnect structures 621. In some examples, one or more conductive interconnect structures 621 can electrically connect packaged semiconductor device 30BB and packaged semiconductor device 30AA together.

Packaged semiconductor device 30CC is attached to substrate 11 of packaged semiconductor device 30BB using an attachment material, such as attachment material 18 described previously. In some examples, packages semiconductor device 30CC is attached so that at least semiconductor die 16A of packaged semiconductor device 30CC is proximate to substrate 11 of packaged semiconductor device 30BB in a face-up orientation (i.e., faces away from packages semiconductor device 30BB). In accordance with the present description, packaged semiconductor device 30CC is attached to packaged semiconductor device 30BB in a laterally offset configuration so as to expose one or more conductive lands 112 on substrate 11 of packaged semiconductor device 30BB. In some examples, substrate 11 of packaged semiconductor device 30CC is electrically connected to substrate 611 with one or more conductive interconnect structures 621. In some examples, substrate 11 of packaged semiconductor device 10CC is electrically connected to substrate 611 with one or more conductive interconnect structures 621. It is understood that one or more of packaged semiconductor devices 30AA, 30BB, and/or 30CC can be rotated 180 degrees about a horizontal plane with respect to other ones of packaged semiconductor devices 30AA, 30BB, and/or 30CC. Also, packaged semiconductor device 30CC can be electrically connected to one or more of packaged semiconductor device 30AA and 30BB with conductive interconnect structures, such as conductive interconnect structures 621.

Packaged semiconductor device 70 further includes a package body 636 covering packaged semiconductor devices 30AA, 30BB, and 30CC as well as top substrate surface 110 and conductive interconnect structures 621. Packaged semiconductor device 70 is an example of a PIP type semiconductor package having single-sided wire bond interconnects. That is, conductive interconnect structures 621 are disposed on only one side of packaged semiconductor devices 30AA, 30BB, and 30CC as illustrated in FIG. 15. Similar to the formation of packaged semiconductor devices 30AA, 30BB, and 30CC, packaged semiconductor device 70 can be formed using a matrix of substrates 611 and an overmolded packaged body 636, which can be singulated after package body 636 is formed to provide a plurality of packaged semiconductor devices 70.

Figure 16:
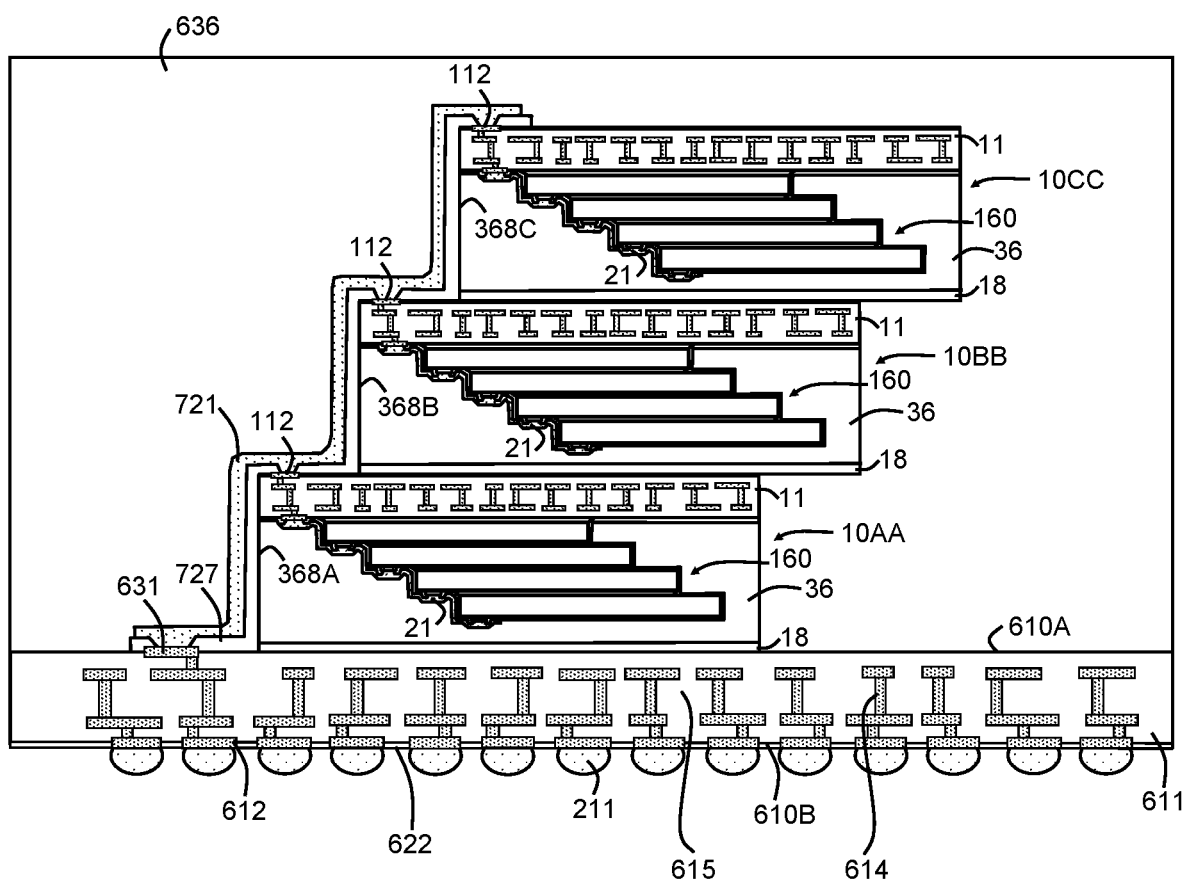
FIG. 16 illustrates a packaged electronic device of the present description.

FIG. 16 illustrates a cross-sectional view of a packaged electronic device 80, such as a packaged semiconductor device 80 in accordance with the present description. Packaged semiconductor device 80 is similar to packaged semiconductor device 50, and only the differences will be described hereinafter.

In packaged semiconductor device 80, packages electronic devices 10AA, 10BB, and 10CC are electrically connected to each other and to substrate 611 with conductive interconnect structures 721 disposed over portions of packaged semiconductor devices 10AA, 10BB, and 10CC and over a portion of substrate top surface 610A of substrate 611 to electrically connect packaged semiconductor devices 10AA, 10BB, and 10CC together and to substrate 11. In some examples, a dielectric layer 727 is disposed underneath interconnect structures 721 and includes openings above conductive lands 112 and conductive pads 631 to facilitate the electrical connection of conductive interconnect structures 721 to packaged semiconductor devices 10AA, 10BB, and 10CC and substrate 611. Dielectric layer 727 can be similar to dielectric layer 27 described previously. In some examples, dielectric layer 727 is formed using 3D printing techniques or other techniques as described previously with dielectric layer 27.

In accordance with the present description, conductive interconnect structures 721 have a shape that substantially conforms to the shape (e.g., stepped-profile) of stacked packaged semiconductor devices 10AA, 10BB, and 10CC. Conductive interconnect structures 721 are disposed over substrates 11 of packaged semiconductor devices 10AA, 10BB, and 10CC as well as over lateral surfaces 368A, 368B, and 368C of packaged semiconductor devices 10AA, 10BB, and 10CC as generally illustrated in FIG. 16.

In some examples, conductive interconnect structures 721 comprise one or more metals, such as copper, copper alloys, gold, silver, or other conductive materials as known to one of ordinary skill in the art. In some examples, conductive interconnect structures 721 can be provided using 3D printing techniques as described previously. In other examples, conductive interconnect structures 721 can be formed using evaporation, sputtering, chemical vapor deposition, plating, or other techniques as known to one of ordinary skill in the art. One advantage of conductive interconnect structures 721 is that they provide a lower profile, which can facilitate packaged semiconductor device 80 having a thinner profile compared to, for example, packaged semiconductor device 50.

Figure 17:
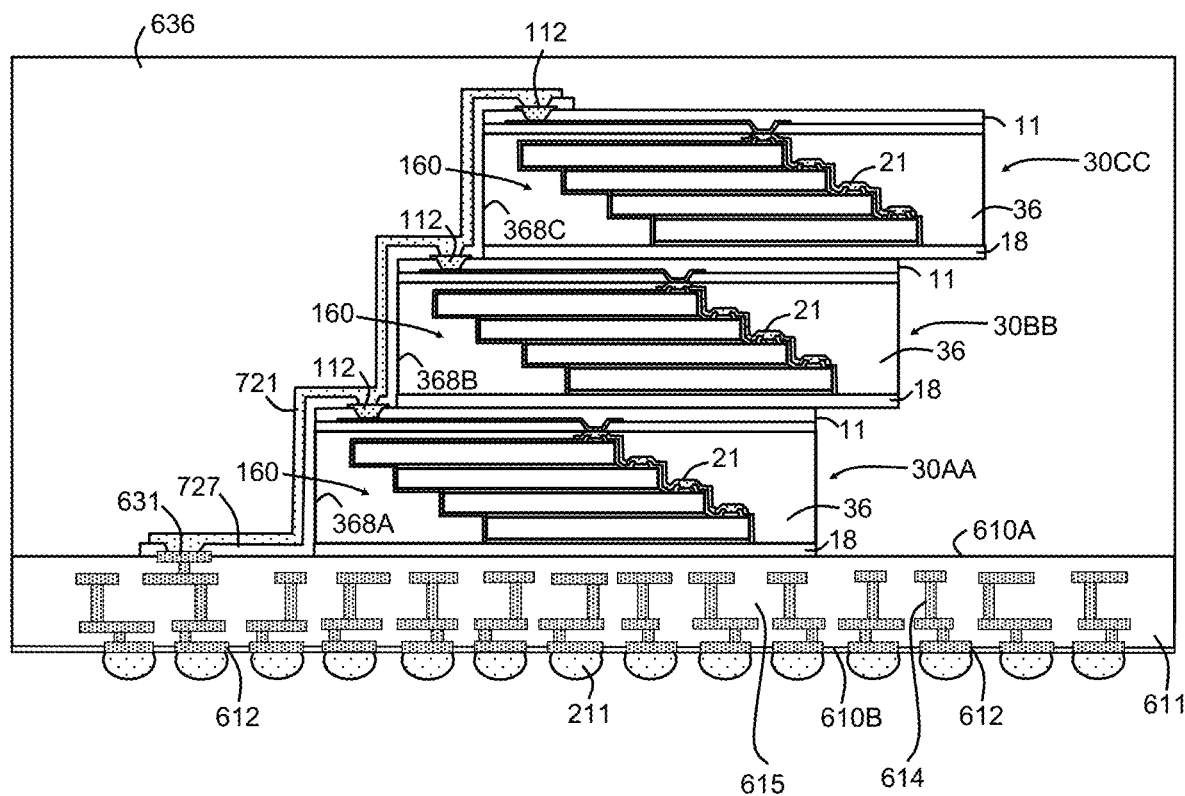
FIG. 17 illustrates a packaged electronic device of the present description.

FIG. 17 illustrates a cross-sectional view of a packaged electronic device 90, such as a packaged semiconductor device 90 in accordance with the present description. Packaged semiconductor device 90 is similar to packaged semiconductor device 70, and only the differences will be described hereinafter. In packaged semiconductor device 90, packages electronic devices 30AA, 30BB, and 30CC are electrically connected to each other and to substrate 611 with conductive interconnect structures 721 disposed on portions of packaged semiconductor devices 30AA, 30BB, and 30CC and a portion of substrate top surface 610A of substrate 611 to electrically connect packaged semiconductor devices 30AA, 30BB, and 30CC together and to substrate 611. In some examples, a dielectric layer 727 is disposed underneath interconnect structures 721 and includes openings to facilitate the electrical connection of conductive interconnect structures 721 to packaged semiconductor devices 30AA, 30BB, and 30CC and substrate 611. Dielectric layer 727 can be similar to dielectric layer 27 described previously. In some examples, dielectric layer 727 is formed using 3D printing techniques or other techniques as described previously.

In accordance with the present description, conductive interconnect structures 721 have a shape that substantially conforms to the shape (e.g., stepped-profile) of stacked packaged semiconductor devices 30AA, 30BB, and 30CC. In some examples, conductive interconnect structures 721 are disposed over substrates 11 of packaged semiconductor devices 30AA, 30BB, and 30CC as well as over lateral surfaces 368A, 368B, and 368C of packaged semiconductor devices 30AA, 30BB, and 30CC as generally illustrated in FIG. 17.

One advantage of conductive interconnect structures 721 is that they provide a lower profile, which can facilitate packaged semiconductor device 90 having a thinner profile compared to, for example, packaged semiconductor device 70.

In summary, a packaged electronic device structure and associated methods have been described that comprise a semiconductor die attached in an off-set stacked configuration to provide a stacked semiconductor device structure. Terminals of each semiconductor die are exposed in the stacked semiconductor device structure and are connected with conformal conductive interconnect structures that substantially follow a stepped outline of the stacked semiconductor device structure. In some examples, the stacked semiconductor device structure is attached to a substrate and the conductive interconnect structures also electrically connect the stacked semiconductor device structure to the substrate. In some examples, a package body covers at least portions of the stacked semiconductor device structure. In some examples, multiple packaged semiconductor devices are attached to together in an offset-stacked configuration and electrically coupled together in the package-in-package configuration. In some examples, conductive interconnect layer comprising conformal layers electrical connect the multiple packaged semiconductor devices together. In some examples, the conductive interconnect structures can be formed using 3D printing techniques. In other examples, plating techniques can be used with a masked seed layer. The structure and method according to the present description provides, among other things, packaged electronic devices having thinner profiles with reliable conductive interconnects that can be formed in a variety of patterns.

While the subject matter of the invention is described with specific example steps and example embodiments, the foregoing drawings and descriptions thereof depict only typical examples of the subject matter and are not therefore to be considered limiting of its scope. Other examples and permutations are similarly envisioned. For instance, semiconductor devices 10, 20 (FIGS. 1, 2, 4, 5, 6, 9, 13, 14, 16) are presented as comprising substrate 11 as a pre-formed substrate, but there can be examples where such substrate 11 can be an RDL substrate. Semiconductor device 30, 40 (FIGS. 7, 8, 10, 11, 12, 15, 17) are shown comprising substrate 11 as an RDL substrate, but there can be examples where such substrate 11 can be a pre-formed substrate. Stacked semiconductor device structure 160 is shown with die 16A, 16B, 16C, and 16D all facing the same direction, but there can be examples where at least one of die 16A, 16B, 16C, 16D faces in a different direction than the others. For instance, semiconductor device 10, 20, 40 can comprise die 16A facing towards substrate 11 and die 16B, 16C, 16D facing away from substrate 11. Semiconductor devices 50, 60, 70, 80, 90 (FIGS. 13-17) are each shown comprising stacks of same-type and same-orientation semiconductor devices, but there can be examples where semiconductor device 50, 60, 70, 80, 90 can comprise individual stacks having different-type semiconductor devices (e.g., having different combinations of semiconductor devices 10, 20, 30, 40), or individual stacks having semiconductor devices with different orientations (e.g., face-up and face-down semiconductor devices 10, 20, 30, 40). It is evident that many envisioned alternatives and variations such as those described will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A packaged semiconductor device, comprising:
   a substrate having a first major surface and a second major surface opposite to the first major surface, the substrate comprising one or more dielectric layers;
   a stacked semiconductor device structure coupled to the first major surface and comprising semiconductor dies having respective die terminals, wherein:
      the semiconductor dies are coupled together so that the respective die terminals are exposed and the stacked semiconductor device structure comprises a stepped profile; and
      the semiconductor dies comprise lateral surfaces proximate to the respective die terminals;
   conductive interconnect structures over portions the stacked semiconductor device structure and coupling the die terminals of the semiconductor dies together; and
   a dielectric structure interposed between the conductive interconnect structures and the lateral surfaces of the semiconductor dies, wherein:
      the dielectric structure has a non-uniform thickness along the lateral surfaces to provide the dielectric structure with an arcuate shape;
      the conductive interconnective structures comprise conformal layers that substantially conforms the stepped profile and the arcuate shape; and
      at least one of the conductive interconnect structures couples at least two die terminals of one of the semiconductor dies together.

2. The packaged semiconductor device of claim 1, wherein:
   at least one of the conductive interconnect structures is over the substrate and electrically couples at least one of the semiconductor dies to the substrate.

3. The packaged semiconductor device of claim 1, wherein:
   the semiconductor dies include a first semiconductor die having a first die terminal coupled to a second semiconductor die having a second die terminal;
   the first semiconductor die has a first die top surface, a first die bottom surface and a first die lateral surface extending between the first die top surface and the first die bottom surface;
   the second semiconductor die has a second die top surface;
   the dielectric structure comprises a first dielectric structure along the first lateral surface; the first dielectric structure comprises:
      a first thickness proximate to where the first semiconductor die is coupled to the second semiconductor die;
      a second thickness proximate to the first die top surface; and
      a third thickness along the second die top surface proximate to the second die terminal; and
   the third thickness is greater than the first thickness and the second thickness.

4. The packaged semiconductor device of claim 1, wherein:
   the dielectric structure comprises portions that are disposed only adjacent lateral surfaces of at least some of the semiconductor dies.

5. The packaged semiconductor device of claim 1, wherein:
   the dielectric structure comprises an organic dielectric layer that covers all of the lateral surfaces of at least one of the semiconductor dies.

6. The packaged semiconductor device of claim 1, further comprising:
   a package body covering the stacked semiconductor device structure.

7. The packaged semiconductor device of claim 1, wherein:
   the conductive interconnect structures comprise plated structures.

8. The packaged semiconductor device of claim 1, wherein:
   the conductive interconnect structures comprise 3D printed structures.

9. The packaged semiconductor device of claim 1, wherein:
- active surfaces of all the semiconductor dies of the stacked semiconductor device structure face towards the first major surface of the substrate; and
- one of the semiconductor dies has die terminals attached to the substrate with the conductive interconnect structures.

10. The packaged semiconductor device of claim 1, wherein:
- active surfaces of all the semiconductor dies of the stacked semiconductor device structure face away from the first major surface of the substrate.

11. A method of forming a packaged semiconductor device, comprising:
- providing a substrate having a first major surface and a second major surface opposite to the first major surface, the substrate comprising one or more organic dielectric layers;
- providing a stacked semiconductor device structure comprising semiconductor dies each having respective die terminals, wherein:
  - the semiconductor dies comprise lateral surfaces proximate to the respective die terminals;
- providing dielectric structures adjacent to the lateral surfaces of the semiconductor dies, wherein the dielectric structures have a non-uniform thickness along the lateral surfaces to provide the dielectric structures with an arcuate shape along each of the lateral surfaces; and
- providing conductive interconnect structures over portions of the stacked semiconductor device structure, the conductive interconnect structures coupling the die terminals of the semiconductor die together, wherein:
  - the semiconductor dies are coupled together so that the respective die terminals are exposed and the stacked semiconductor device structure comprises a stepped profile;
  - the stacked semiconductor device structure is coupled to the substrate; and
  - the conductive interconnect structures comprise a conformal layer that substantially follows the stepped profile and the arcuate shape of the dielectric structures;
- providing the stacked semiconductor device structure comprises:
  - providing the stacked semiconductor device structure attached to a carrier substrate;
- the method further comprises:
  - forming a package body covering the stacked semiconductor device structure; and
  - removing the carrier substrate; and
- providing the substrate comprises attaching the substrate adjacent to one of the semiconductor dies in the stacked semiconductor device structure.

12. The method of claim 11, wherein:
- providing the conductive interconnect structures comprises 3D printing the conductive interconnect structures over portions of the stacked semiconductor device structure.

13. The method of claim 11, wherein:
- providing the conductive interconnect structures comprises plating the conductive interconnect structures.

14. The method of claim 11, wherein:
- providing the semiconductor dies includes providing a first semiconductor die having a first die terminal coupled to a second semiconductor die having a second die terminal;
- the first semiconductor die has a first die top surface, a first die bottom surface and a first die lateral surface extending between the first die top surface and the first die bottom surface;
- the second semiconductor die has a second die top surface;
- providing the dielectric structure comprises providing a first dielectric structure along the first lateral surface;
- the first dielectric structure comprises:
  - a first thickness proximate to where the first semiconductor die is coupled to the second semiconductor die;
  - a second thickness proximate to the first die top surface; and
  - a third thickness along the second die top surface proximate to the second die terminal; and
- the third thickness is greater than the first thickness and the second thickness.

15. A packaged semiconductor device, comprising:
- a first substrate having a first major surface and a second major surface opposite to the first major surface, and first substrate terminals disposed proximate to the second major surface of the first substrate, the substrate comprising one or more organic dielectric layers;
- a first stacked semiconductor device structure coupled to the first major surface of the first substrate and comprising first semiconductor dies each having first die terminals, wherein:
  - the first semiconductor dies are coupled together so that the first die terminals are exposed and the first stacked semiconductor device structure comprises a first stepped profile;
- first conductive interconnect structures electrically coupling the first die terminals of the first semiconductor dies together, wherein:
  - the first conductive interconnect structures substantially conform to the first stepped profile;
- a first package body covering the first stacked semiconductor device structure;
- a second substrate having a first major surface and a second major surface opposite to the first major surface and second substrate terminals disposed proximate to the second major surface of the second substrate;
- a second stacked semiconductor device structure coupled to the first major surface of the second substrate and comprising second semiconductor dies each having second die terminals, wherein:
  - the second semiconductor dies are coupled together so that the second die terminals are exposed and the second stacked semiconductor device structure comprises a second stepped profile;
- second conductive interconnect structures electrically coupling the second die terminals of the second semiconductor dies together, wherein:
  - the second conductive interconnect structures substantially conform to the second stepped profile; and
- a second package body covering the second stacked semiconductor device structure, wherein:
  - the second package body is coupled to the second major surface of the first substrate in an offset configuration to expose the first substrate terminals.

16. The packaged semiconductor device of claim 15, further comprising:
- a third substrate having a first major surface and a second major surface opposite to the first major surface and third substrate terminals disposed proximate to the first major surface of the third substrate, wherein the first package body is coupled to the first major surface of the third substrate; and third conductive interconnect structures electrically coupling one or more of the first substrate terminals or of the second substrate terminals to the third substrate terminals.

17. The packaged semiconductor device of claim 16, wherein:

the third conductive interconnect structures conform to one or more of the first package body, the first substrate, the second package body, or the second substrate.

* * * * *